United States Patent
Sano

(10) Patent No.: US 8,258,841 B2
(45) Date of Patent: Sep. 4, 2012

(54) PLL CIRCUIT AND OPTICAL DISC APPARATUS

(75) Inventor: Masaki Sano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 232 days.

(21) Appl. No.: 12/773,971

(22) Filed: May 5, 2010

(65) Prior Publication Data

US 2010/0295584 A1    Nov. 25, 2010

(30) Foreign Application Priority Data

May 22, 2009   (JP) ................................. 2009-124160

(51) Int. Cl.
*H03L 7/06* (2006.01)
(52) U.S. Cl. ...................................................... 327/159
(58) Field of Classification Search ................... 327/159
See application file for complete search history.

(56) References Cited

U.S. PATENT DOCUMENTS 7,295,077 B2 * 11/2007 Thomsen et al. ............... 331/10
7,605,661 B2    10/2009 Sano
2008/0211589 A1   9/2008 Sano

FOREIGN PATENT DOCUMENTS

JP          2008-205730       9/2008

* cited by examiner

*Primary Examiner* — Lincoln Donovan
*Assistant Examiner* — Daniel Rojas
(74) *Attorney, Agent, or Firm* — Young & Thompson

(57) ABSTRACT

A PLL circuit includes a polyphase reference clock output circuit that outputs reference clocks, a polyphase frequency divider circuit that outputs divided clocks, which is obtained by dividing frequencies of the reference clocks, a selection switch circuit that selects one of the reference clocks or one of the divided clocks, and outputs the selected clock as a selected clock, a digital VCO that uses the selected clock as an operating clock, and outputs delay amount data indicating a phase difference between an output clock and an ideal phase, where the output clock has a frequency that fluctuates according to a value of frequency control input data, and the ideal phase is calculated according to the output clock and the value of the frequency control input data, and a selection circuit that selects and outputs the output clock synchronized with the divided clocks according to the delay amount data.

10 Claims, 17 Drawing Sheets

| C1 | A11 | B11 | C11 | D11 | E11 |
|---|---|---|---|---|---|
| 0 | 1 | 0 | 0 | 0 | 0 |
| 1 | 0 | 1 | 0 | 0 | 1 |
| 0 | 0 | 1 | 0 | 0 | 1 |
| 1 | 0 | 0 | 1 | 0 | 0 |
| 0 | 0 | 0 | 1 | 1 | 1 |
| 1 | 1 | 0 | 0 | 1 | 1 |

Fig. 11

| | POLYPHSE REFERENCE CLOCK CIRCUIT | REFERENCE CLOCK OUTPUT CIRCUIT | DIGITAL VCO OPERATING CLOCK | | SYSTEM CLOCK 1 | SYSTEM CLOCK 2 |
|---|---|---|---|---|---|---|
| OPTICAL DISC APPARATUS 300 | 200MHz | — | 200MHz | 100MHz | 133MHz | 100MHz |
| OPTICAL DISC APPARATUS 400 | 200MHz | 400MHz | 200MHz | | 133MHz | 100MHz |

Fig. 15

PLL CIRCUIT AND OPTICAL DISC APPARATUS

INCORPORATION BY REFERENCE

This application is based upon and claims the benefit of priority from Japanese patent application No. 2009-124160, filed on May 22, 2009, the disclosure of which is incorporated herein in its entirety by reference.

BACKGROUND

1. Field of the Invention

The present invention relates to a PLL (Phase Locked Loop) circuit and an optical disc apparatus.

2. Description of Related Art

An optical disc apparatus for recording and reproducing data to and from an optical disc media such as CD and DVD is widely used at the moment. Spirals (wobble) of a predetermined cycle are fabricated in grooves formed on the disc surface of an optical disc media. An optical disc apparatus provides a wobble signal (hereinafter referred to as a rotation synchronizing signal) generated according to this wobble to a PLL circuit, and generates a synchronous clock signal at the time of record and reproduction. The frequency of this rotation synchronizing signal is different between the outer and the inner circumstance of a disc.

Therefore, the optical disc apparatus includes a PLL circuit which fluctuates the frequency of a synchronous clock signal according to the rotation synchronizing signal. In order to accurately record and reproduce data to and from an optical disc media, such PLL circuit needs to generate a clock signal which synchronizes with a target clock signal with high phase accuracy.

An example of the PLL circuit which generates a clock signal synchronized with a reference signal accurately is disclosed in Japanese Unexamined Patent Application Publication No. 2008-205730. FIG. 17 illustrates the configuration of a PLL circuit 1 disclosed in Japanese Unexamined Patent Application Publication No. 2008-205730. As illustrated in FIG. 17, the PLL circuit 1 includes a polyphase reference clock output circuit 10, a digital VCO (Voltage Controlled Oscillator) 20, a selection circuit 30, a frequency control terminal 40, and a high precision clock output terminal 50.

The polyphase reference clock output circuit 10 includes odd number of inverter circuits IV1 to IV7. The inverter circuits IV1 to IV7 are connected in series sequentially, and an output of the last stage inverter circuit IV7 is connected with an input of the first stage inverter circuit IV1. Outputs from the inverter circuits IV1 to IV7 are input to the selection circuit 30 as polyphase reference clocks CK1 to CK7, respectively.

The digital VCO 20 outputs an output clock OCK including a frequency which fluctuates according to the value of a frequency control input Mf which is input from the frequency control terminal 40, and delay amount data which indicates a phase difference between the phase of an ideal clock calculated according to the value of the frequency control input Mf, and the phase of the abovementioned output clock OCK. This digital VCO 20 operates with the reference clock CK1 as an operating clock.

The selection circuit 30 includes multiple D flip-flops FF1 to FF7 and a selector SEL1. The output clock OCK is input to each data input terminal D of the D flip-flops FF1 to FF7. Further, the reference clocks CK1 to CK7 are input to each clock input terminal of the D flip-flops FF1 to FF7. Then, each data output terminal Q outputs delay clocks F1 to F7 at rising edges of the reference clocks CK1 to CK7. The selector SEL1 selects one of the delay clocks F1 to F7 according to the delay amount data, and outputs the selected delay clock to the high precision clock output terminal 50.

Such PLL circuit 1 can output a high precision clock which includes high phase precision to the clock signal which should be output from the high precision clock output terminal 50.

SUMMARY

In recent years, record and reproduction speed of data to and from an optical disc media of an optical disc apparatus, such as CD and DVD, is rapidly increasing. Thus, the abovementioned polyphase reference clock output circuit 10 of the PLL circuit 1 disclosed in Japanese Unexamined Patent Application Publication No. 2008-205730 needs to increase the frequency of the reference clock to generate. Moreover, as the reference clock CK1 from the polyphase reference clock output circuit 10 is used as the operating clock, the digital VCO 20 also needs to operate at high speed. Such high frequency operation of the digital VCO 20 increases the power consumption of the PLL circuit 1.

Further, there is an optical disc apparatus which can operate only with the power supply from an interface such as USB in consideration of advantages, such as convenience, portability, and space-saving. However, there is a limitation in the power supplied from the interface such as USB, thus the optical disc apparatus is required to reduce the power consumption. Accordingly, if the power is supplied from the power supply such as AC adapter to such optical disc apparatus, and there is no problem in the power consumption (this case is hereinafter referred to as a high speed operation mode), data is recorded and reproduced to an optical disc apparatus at high speed. On the other hand, in order to operate only with the power supply from the interface such as USB and reduce the power consumption as much as possible (this mode is hereinafter referred to as a low power consumption mode), the record and reproduction speed of data to and from the optical disc apparatus is reduced so as to lower the power consumption.

However, the digital VCO 20 of the PLL circuit 1 only uses the reference clock CK1 as an operating clock. Therefore, the present inventor has found a problem that if the capability of the high speed operation in the high speed operation mode of an optical disc apparatus is increased, and the frequency of the reference clock generated by the polyphase reference clock output circuit 10 is increased, the power consumption of the digital VCO 20 will increase accordingly. In this case, even when trying to reduce the power consumption as low as possible in the low power consumption mode of the optical disc apparatus, the power consumption of the digital VCO 20 increases as mentioned above, and it is not possible for the PLL circuit 1 to operate with low power consumption. Therefore, it is desired to realize a PLL circuit which can operate the digital VCO with an optimal operating clock in the high speed operation mode and the lower power consumption mode of the optical disc apparatus.

An exemplary aspect of the present invention is a PLL circuit that includes a polyphase reference clock output circuit that outputs a plurality of reference clocks with different phases, a polyphase frequency divider circuit that outputs a plurality of divided clocks, where the plurality of divided clocks are obtained by dividing frequencies of the plurality of reference clocks by a predetermined value, a selection switch circuit that selects one of the plurality of reference clocks or one of the plurality of divided clocks, and outputs the selected clock as a selected clock, a digital VCO that uses the selected clock as an operating clock, and outputs delay amount data indicating a phase difference between an output clock and an ideal phase, where the output clock includes a frequency that fluctuates according to a value of frequency control input data, and the ideal phase is calculated according to the output clock and the value of the frequency control input data, and a selection circuit that selects and outputs the output clock, where the output clock is synchronized with one of the plurality of divided clocks according to the delay amount data.

In the PLL circuit according to the present invention, a selection switch circuit selects either the reference clock output from the polyphase reference clock output circuit or the divided clock output from the polyphase frequency divider circuit. Then, the digital VCO operates with the clock selected by the selection switch circuit as an operating clock. The divided clock is obtained by dividing the frequency of the reference clock by a predetermined value, thus the clock frequency of the divided clock is lower than that of the reference clock. Therefore, in order to operate the digital VCO at high speed, the selection switch circuit selects the reference clock, and in order to reduce the power consumption of the digital VCO, the selection switch circuit selects the divided clock. Thus it is possible to operate the digital VCO with an optimal operating clock.

The operation mode of the PLL circuit according to the present invention can be variable which enables both the high speed operation and the low power consumption operation as necessary.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 11 is a logical value table explaining the relationship between an input and an output of the divide-by-1.5 circuit and logical values of internal nodes according to the second exemplary embodiment;

FIG. 15 is a table for comparing the clock frequency of each unit of the optical disc apparatus according to the second exemplary embodiment and the optical disc apparatus according to the related art;

DETAILED DESCRIPTION OF THE EXEMPLARY EMBODIMENTS

First Exemplary Embodiment

Hereafter, a specific first exemplary embodiment incorporating the present invention is described with reference to the drawings. The first exemplary embodiment applies the present invention to a PLL circuit of an optical disc apparatus.

Figure 1:
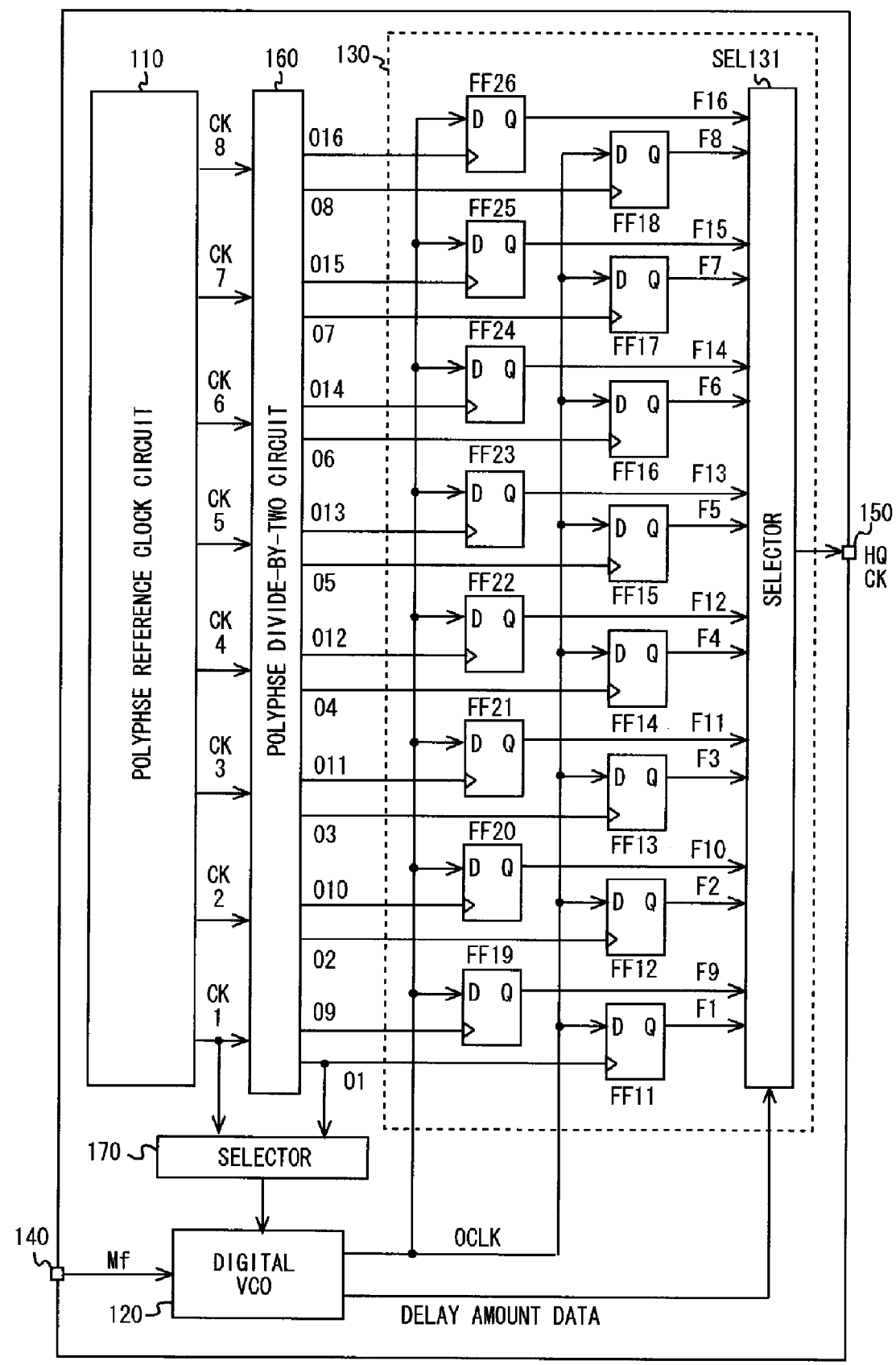
FIG. 1 is a circuit block diagram of a PLL circuit according to a first exemplary embodiment.

The configuration of a PLL circuit 100 according to the first exemplary embodiment is illustrated in FIG. 1. As illustrated in FIG. 1, the PLL circuit 100 includes a polyphase reference clock output circuit 110, a digital VCO 120, a selection circuit 130, a frequency control terminal 140, a high precision clock output terminal 150, a polyphase divide-by-two circuit 160, and a selector 170.

The polyphase reference clock output circuit 110 outputs reference clocks CK1 to CK8, which are turned into multiphase clocks. Suppose that the reference clocks CK1 to CK8 shall have different phases from each other. For example, the reference clocks CK1 to CK8 have clock waveforms shifted by 45 degrees in order.

Figure 2:
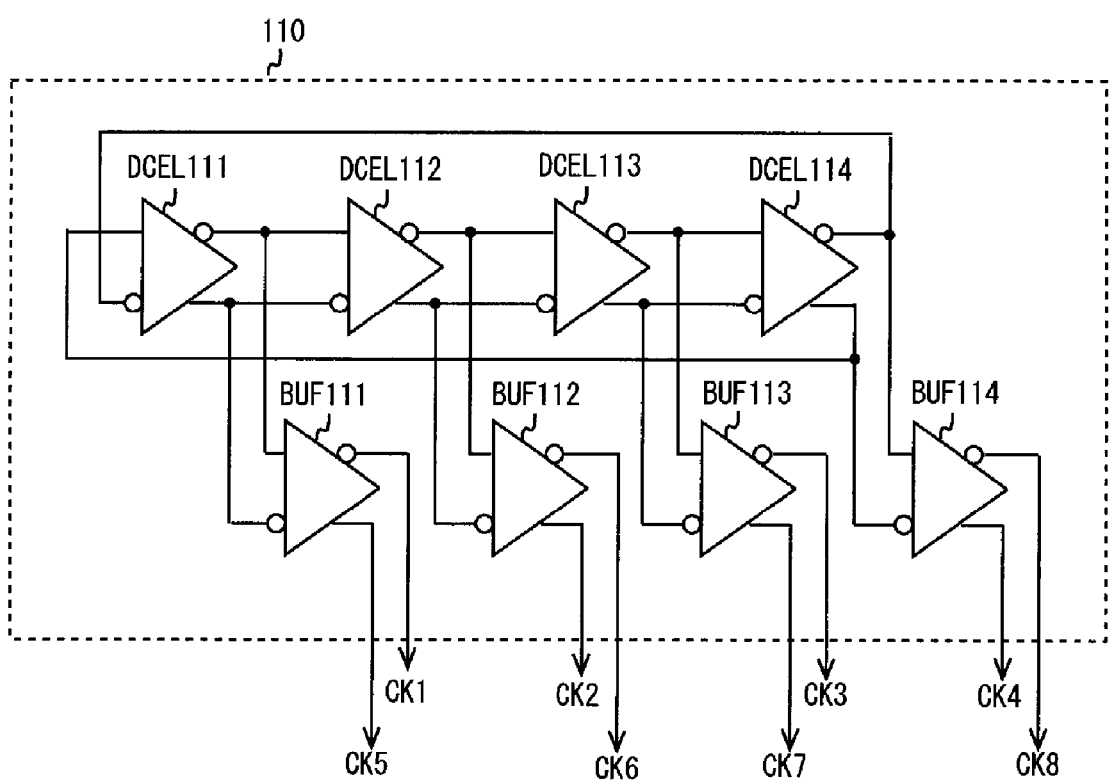
FIG. 2 is a circuit block diagram of a polyphase reference clock output circuit according to the first exemplary embodiment.

An example of the configuration of the polyphase reference clock output circuit 110 is illustrated in FIG. 2. As illustrated in FIG. 2, the polyphase reference clock output circuit 110 includes delay cells DCEL111 to DCEL114 and buffer circuits BUF111 to BUF114.

The delay cells DCEL111 to DCEL114 input differential data from the previous stage, respectively, and output the differential data to the subsequent stages. Further, the delay cells DCEL111 to DCEL114 are connected to form a ring as illustrated in FIG. 2. For example, an inverting output terminal and a non-inverting input terminal of the delay cell DCEL111 are connected with a non-inverting input terminal and an inverting input terminal of the delay cell DCEL112, respectively. Similarly, an inverting output terminal and a non-inverting input terminal of the delay cell DCEL112 are connected with a non-inverting input terminal and an inverting input terminal of the delay cell DCEL113, respectively. An inverting output terminal and a non-inverting input terminal of the delay cell DCEL113 are connected with a non-inverting input terminal and an inverting input terminal of the delay cell DCEL114, respectively. An inverting output terminal and a non-inverting input terminal of the delay cell DCEL114 are connected with a non-inverting input terminal and an inverting input terminal of the delay cell DCEL111, respectively.

The buffer circuits BUF111 to BUF114 convert the level of an input signal into a signal level suited for the circuit connected in the subsequent stage. The buffer circuits BUF111 to BUF114 also input the differential data from the previous stages, respectively, and output the differential data to the subsequent stages. For example, the buffer circuit BUF111 inputs the inverting output signal and the non-inverting output signal of the delay cell DCEL111 into a non-inverting input terminal and an inverting input terminal, respectively. Then, the reference clocks CK1 and CK5 are output from the inverting output terminal and the non-inverting output terminal, respectively.

Similarly, the buffer circuit BUF112 inputs the inverting output signal and the non-inverting output signal of the delay cell DCEL112 into a non-inverting input terminal and an inverting input terminal, respectively. Then, the reference clocks CK6 and CK2 are output from the inverting output terminal and the non-inverting output terminal, respectively. The buffer circuit BUF113 inputs the inverting output signal and the non-inverting output signal of the delay cell DCEL113 into a non-inverting input terminal and an inverting input terminal, respectively. Then, reference clocks CK3 and CK7 are output from an inverting output terminal and a non-inverting output terminal, respectively. The buffer circuit BUF114 inputs the inverting output signal and the non-inverting output signal of the delay cell DCEL114 into a non-inverting input terminal and an inverting input terminal, respectively. Then, reference clocks CK4 and CK8 are output from the inverted output terminal and the non-inverting output terminal, respectively.

The above configuration enables the polyphase reference clock output circuit 110 to output the reference clocks CK1 to CK8 having phase steps of 45 degrees. Note that the number of stages of the abovementioned delay cells may be further increased, the phase step may be smaller than 45 degrees, and eight or more reference clocks may be output.

Figure 3:
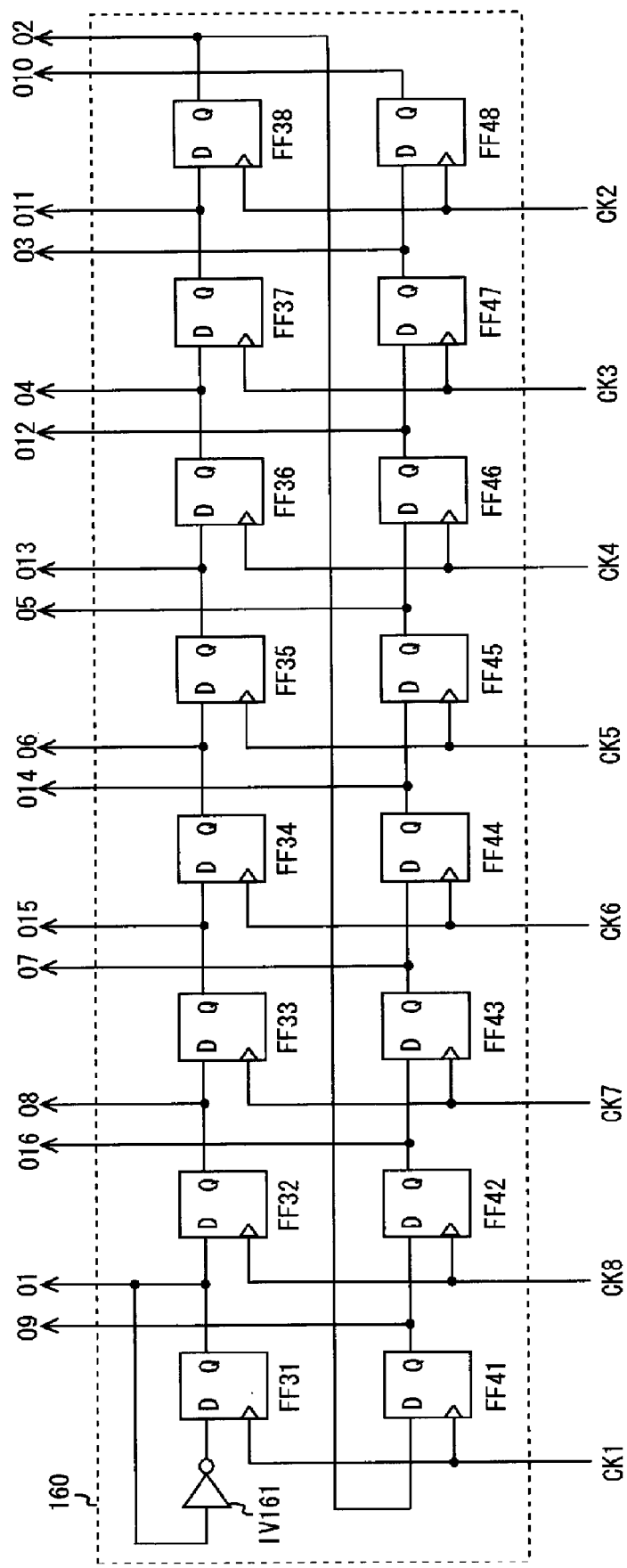
FIG. 3 is a circuit block diagram of a polyphase divide-by-two circuit according to the first exemplary embodiment.

The polyphase divide-by-two circuit 160 divides the frequencies of the reference clocks CK1 to CK8, and outputs the divided clocks O1 to O16. However, the phase differences of the divided clocks O1 to O16 include the clock waveforms having the phase step of 45 degrees in a similar way as the reference clocks CK1 to CK8. FIG. 3 illustrates an example of the configuration of the polyphase divide-by-two circuit 160. As illustrated in FIG. 3, the polyphase divide-by-two circuit 160 includes D flip-flops FF31 to FF38, FF41 to FF48, and an inverter circuit IV161.

The D flip-flop FF31 inputs the reference clock CK1 into a clock input terminal, inputs an output signal from the inverter circuit IV161 into a data input terminal D, and outputs the divided clock O1 from the data input terminal D. The D flip-flop FF32 inputs the reference clock CK8 into a clock input terminal, inputs the divided clock O1 into a data input terminal D, and outputs the divided clock O8 from the data input terminal D. The D flip-flop FF33 inputs the reference clock CK7 into a clock input terminal, inputs the divided clock O8 into a data input terminal D, and outputs the divided clock O15 from the data input terminal D. The D flip-flop FF34 inputs the reference clock CK6 into a clock input terminal, inputs the divided clock O15 into a data input terminal D, and outputs the divided clock O6 from the data input terminal D.

The D flip-flop FF35 inputs the reference clock CK5 into a clock input terminal, inputs the divided clock O6 into a data input terminal D, and outputs the divided clock O13 from the data input terminal D. The D flip-flop FF36 inputs the reference clock CK4 into a clock input terminal, inputs the divided clock O13 into a data input terminal D, and outputs the divided clock O4 from the data input terminal D. The D flip-flop FF37 inputs the reference clock CK3 into a clock input terminal, inputs the divided clock O4 into a data input terminal D, and outputs the divided clock O11 from the data input terminal D. The D flip-flop FF38 inputs the reference clock CK2 into a clock input terminal, inputs the divided clock O11 into a data input terminal D, and outputs the divided clock O2 from the data input terminal D.

The D flip-flop FF41 inputs the reference clock CK1 into a clock input terminal, inputs the divided clock O2 into a data input terminal D, and outputs the divided clock O9 from the data input terminal D. The D flip-flop FF42 inputs the reference clock CK8 into a clock input terminal, inputs the divided clock O9 into a data input terminal D, and outputs the divided clock O16 from the data input terminal D. The D flip-flop FF43 inputs the reference clock CK7 into a clock input terminal, inputs the divided clock O16 into a data input terminal D, and outputs the divided clock O7 from the data input terminal D. The D flip-flop FF44 inputs the reference clock CK6 into a clock input terminal, inputs the divided clock O7 into a data input terminal D, and outputs the divided clock O14 from the data input terminal D.

The D flip-flop FF45 inputs the reference clock CK5 into a clock input terminal, inputs the divided clock O14 into a data input terminal D, and outputs the divided clock O5 from the data input terminal D. The D flip-flop FF46 inputs the reference clock CK4 into a clock input terminal, inputs the divided clock O5 into a data input terminal D, and outputs the divided clock O12 from the data input terminal D. The D flip-flop FF47 inputs the reference clock CK3 into a clock input terminal, inputs the divided clock O12 into a data input terminal D, and outputs the divided clock O3 from the data input terminal D. The D flip-flop FF48 inputs the reference clock CK2 into a clock input terminal, inputs the divided clock O3 into a data input terminal D, and outputs the divided clock O10 from the data input terminal D.

The inverter circuit IV161 inputs the divided clock O1, and outputs an inverting signal thereof to the data input terminal of the D flip-flop FF31.

Figure 4:
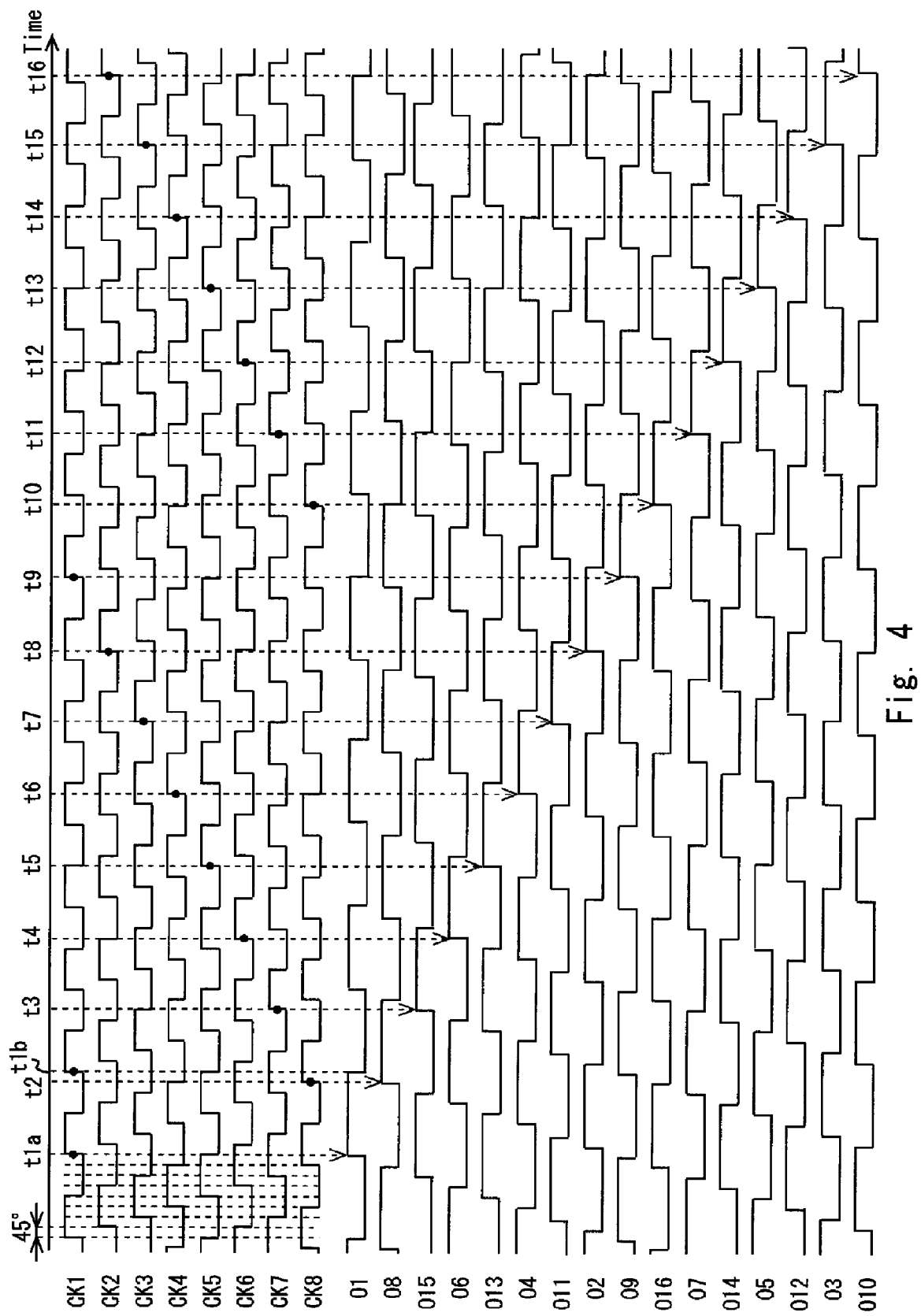
FIG. 4 is a timing chart illustrating the operation of the polyphase divide-by-two circuit according to the first exemplary embodiment.

FIG. 4 is an operation timing chart of the polyphase divide-by-two circuit 160 with the above configuration. As illustrated in FIG. 4, the D flip-flop FF31 latches the high level signal of the inverter circuit IV161, and outputs it as the divided clock O1 at the time t1$a$, which is a rising edge timing of the reference clock CK1. Note that the D flip-flop FF31 latches the low level signal of the inverter circuit IV161, and outputs it as the divided clock O1 at the time t1$b$, which is a rising edge timing of the reference clock CK1. Therefore, the divided clock O1 is a clock signal obtained by dividing the reference clock CK1 by two.

The D flip-flop FF32 latches the divided clock O1, and outputs it as the divided clock O1 at the timing t2, which is a rising edge timing of the reference clock CK8. The D flip-flop FF33 latches the divided clock O8, and outputs it as the divided clock O15 at the timing t3, which is a rising edge timing of the reference clock CK7. Similarly, each of the D flip-flops FF34 to FF38, and FF41 to FF48 latches and outputs the outputs from the previous stage D flip-flops, respectively, at the time t4 to t16. Note that as a similar operation is carried out before the time t1, the polyphase divide-by-two circuit 160 outputs the divided clocks O1 to O16 having phase steps of 45 degrees, as a result.

The selector 170 (selection switch circuit) selects either the reference clock CK1, which is output from the abovementioned polyphase reference clock output circuit 110, or the divided clock O1, which is output from the polyphase divide-by-two circuit 160, and outputs the selected clock to the digital VCO 120. Note that the clock signal input to the selector 170 is not limited to the reference clock CK1 and the divided clock O1. That is, the selector 170 may input one of the reference clocks CK1 to CK8, or one of the divided clocks O1 to O16.

The frequency control terminal 140 is an input terminal of frequency control input data Mf which specifies the frequency of the output clock output from the digital VCO 120. Note that this frequency control input data Mf has a value corresponding to a rotation synchronizing signal obtained from wobble of an optical disc, such as CD.

The digital VCO 120 operates with the reference clock CK1 or the divided clock O1 selected by the selector 170 as an operating clock. If the reference clock CK1 is used as the operating clock of the digital VCO 120, the frequency of the reference clock CK1 is desirably specified to be higher than the maximum frequency of the output clock OCK output from the digital VCO 120. The digital VCO 120 outputs the output clock OCK having the frequency which fluctuates according to the value of the frequency control input data Mf. Further, the digital VCO 120 outputs the delay amount data that indicates a phase difference between the phase of the output clock OCK and the phase of an ideal clock calculated according to the value of the frequency control input data Mf. Note that the ideal clock is a target clock to synchronize a rising edge of a high precision clock output from the PLL circuit 100. The phase of this ideal clock is hereinafter referred to as an ideal phase.

Figure 5:
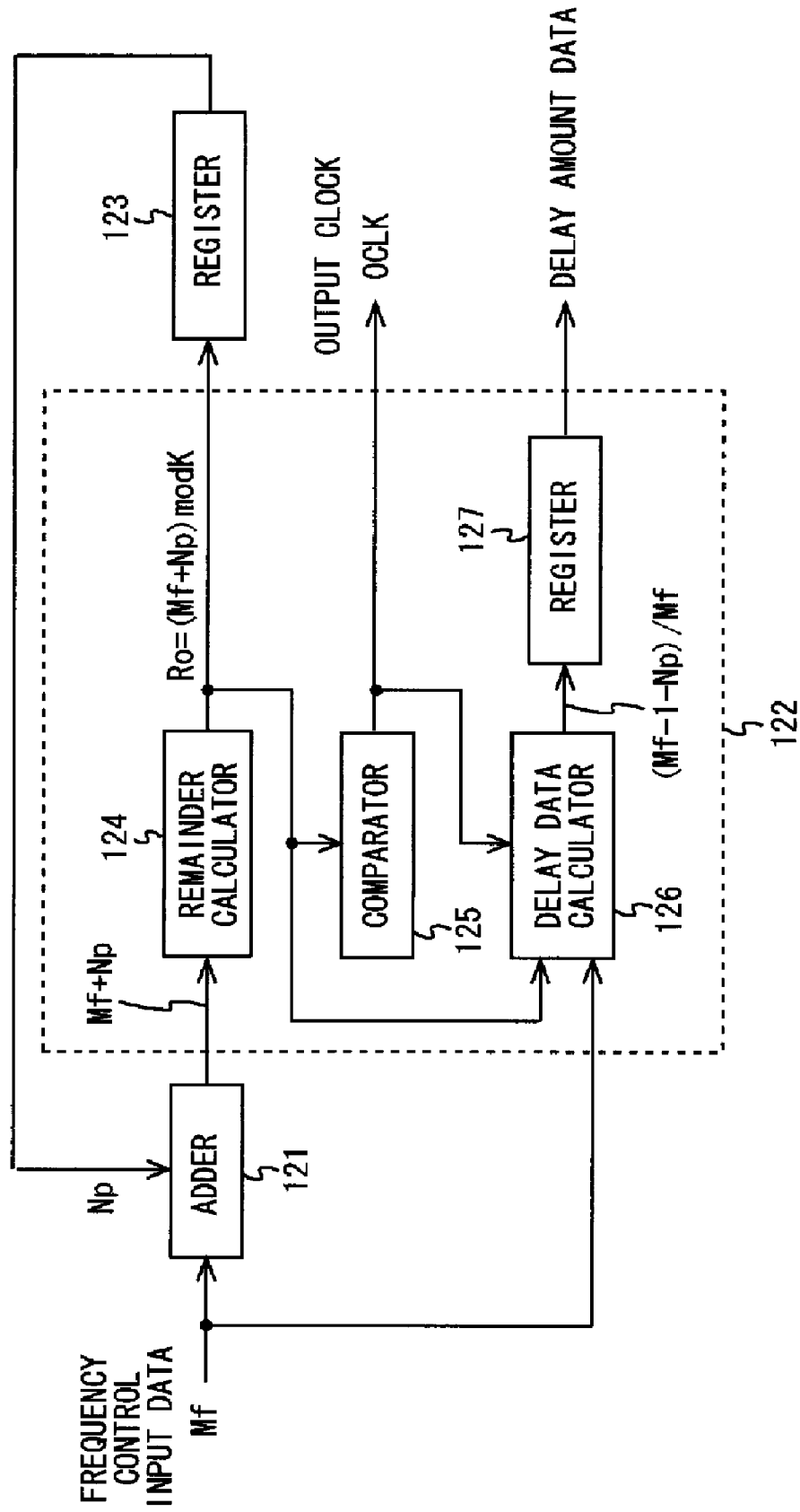
FIG. 5 is a block diagram of a digital VCO according to the first exemplary embodiment.

FIG. 5 is a block diagram of the digital VCO 120. As illustrated in FIG. 5, the digital VCO 120 includes an adder 121, a decoder 122, and a register 123. As mentioned above, the digital VCO 120 operates with the reference clock CK1 or the divided clock O1 selected by the selector 170 as the operating clock.

The adder 121 adds the frequency control input data Mf and internal phase information Np, whenever a rising edge of the operating clock is input. The decoder 122 generates the output clock OCK, the delay amount data, and a remainder calculation output Ro according to the calculation result pf the adder 121 and the frequency control input data Mf. The register 123 stores the remainder calculation output Ro generated by the decoder 122. The value of the remainder calculation output Ro stored in the register 123 is the internal phase information Np at the next timing.

The decoder 122 includes a remainder calculator 124, a comparator 125, a delay data calculator 126, and a register 127. The remainder calculator 124 divides the value (Mf+Np) input from the adder 121 by the value K (Mf<<K), which is the value calculated by adding 1 to the maximum value of the internal phase information. Then, the remainder ((Mf+Np) modK) is output to the comparator 125 and the delay data calculator 126 as the remainder calculation output Ro. Note that (A mod B) indicates a remainder when dividing A by B. If the remainder calculation output Ro input from the remainder calculator 124 is smaller than K/2, the comparator 125 outputs "1". If the remainder calculation output Ro input from the remainder calculator 124 is larger than K/2, the comparator 125 outputs "0". The delay data calculator 126 computes the delay amount data according to the phase of the ideal clock, which is computed using the remainder calculation output Ro input from the remainder calculator 124 and the frequency control input data Mf, and the phase of the output clock OCK. The register 127 stores the computed delay amount data. Then, the register 127 outputs the delay amount data to the selection circuit 130 at a predetermined timing.

The operation of the decoder 122 is explained hereinafter. The adder 121 and the decoder 122 synchronize with the reference clock CK1 or the divided clock O1 selected by the selector 170 to operate (the clock selected and output by the selector 170 is hereinafter referred to as a reference operating clock). Therefore, each value output from the adder 121 and the decoder 122 is updated at the clock cycle of the reference operating clock as unit time. Thus, if each unit of the digital VCO 120 repeatedly carries out processes for each clock cycle of the reference operating clock, the internal phase information Np increases by Mf at each clock frequency.

Suppose that the clock frequency of the reference operating clock is Fref, the oscillating frequency Fock of the output clock OCK output from the comparator 125 is expressed as (Fref×Mf/K). If K/Mf is an integer N, the clock frequency F of the output clock OCK is to be a clock frequency with a constant cycle obtained by dividing Fref by N. However, if K/Mf is not an integer (in other words, if K/Mf=N+α (0<α<1)), the output clock OCK is obtained as a mixed clock including the clock having N/Fref cycle and the clock having (N+1)/Fref cycle.

The delay data calculator 126 computes the difference of the phase of the ideal clock and that of the output clock OCK by processing the internal phase information Np. To be more specific, the delay data calculator 126 calculates (Mf−1−Np)/Mf, when a rising edge of the output clock OCK is input, and outputs the calculation result to the register 127.

Figure 6:
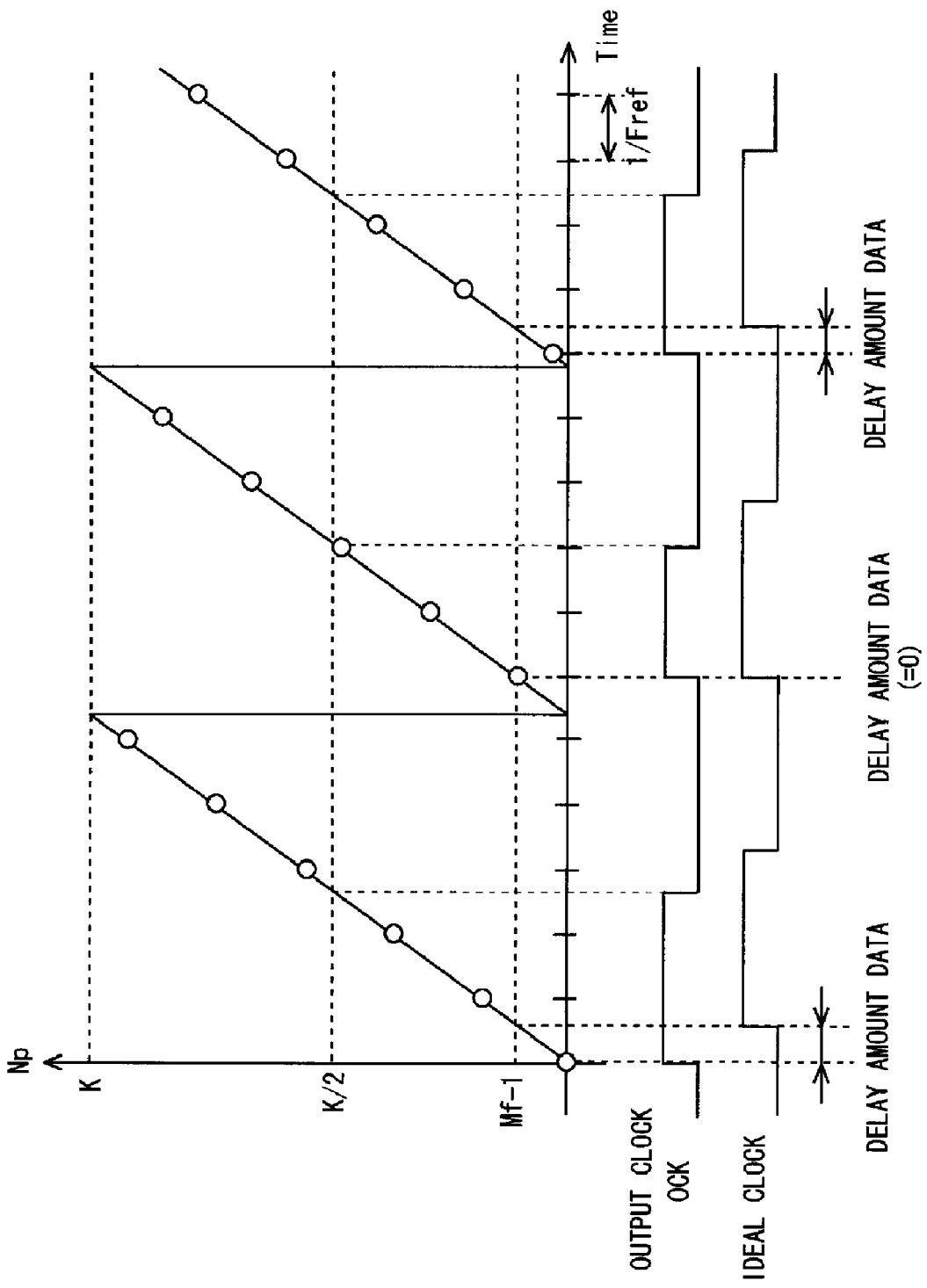
FIG. 6 is a timing chart explaining the operation of the digital VCO according to the first exemplary embodiment.

FIG. 6 is a timing chart illustrating the operation of the decoder 122. The graph of FIG. 6 uses the value of the internal phase information Np for the vertical axis, and time for the horizontal axis, to indicate the change of the internal phase information Np. FIG. 6 also includes a pattern diagram with the same time axis as the above graph, which illustrates the phase difference of the output clock OCK and the ideal clock.

As illustrated in FIG. 6, if Mf is a constant value, the value of NP is plotted in the shape of sawtooth wave. The timing when the value of Np exceeds the predetermined threshold (Mf−1) shall be defined as an ideal phase. In this case, the difference between the value of Np and (Mf−1) at a rising edge timing of the output clock OCK is proportional to the difference between the output timing of the output clock OCK and the ideal phase. In other words, if Mf is a constant value, the time until the value of Np exceeds Mf−1 at the output timing of the output clock OCK can be computed by dividing (Mf−1−Np) by Mf.

The delay amount data can be defined by determining where in the order of time zone the moment is included when the value of Np reaches Mf−1, if the clock cycle of the reference operating clock is equally time-shared by any integer of 2 or more. For example, when the delay data calculator 126 equally divides one cycle (1/Fref) of the reference operating clock by m (m is an integer of 2 or more) to compute the delay amount data, if T<t<=T+1−/m×Fref, where the output timing of the output clock OCK is T and the timing of the ideal phase is t, then the value of the delay amount data is 1. If T+1−/m×Fref<t≦T+2−/m×Fref, the value of the delay amount data is 2. Accordingly, in general, it is T+n/m× Fref<t≦T+(n+1)/m×Fref (n is a natural number of m or less). Note that if T=t, the phase difference between the output clock OCK and the ideal clock is 0, thus the value of the delay amount data is 0. In the first exemplary embodiment, m=16.

The delay data calculator 126 outputs the delay amount data calculated by the abovementioned calculation method to the register 127. Then, the register 127 temporarily stores the delay amount data and outputs it to the selection circuit 130.

The operation of the digital VCO 120 has been explained so far. Note that the digital VCO 120 operates with the reference operating clock as the operating clock, and the reference operating clock is either the reference clock CK1 or the divided clock O1 selected by the selector 170. The divided clock O1 is obtained by dividing the frequency of the reference clock CK1 by two. Therefore, the operation speed of the digital VCO 120 when using the divided clock O1 as the reference operating clock is approximately half of when using the reference clock CK1 as the reference operating clock. In other words, this means that if the dividing clock O1 is used as the reference operating clock, the power consumption of the digital VCO 120 can be approximately half of when using the reference clock CK1 as the reference operating clock. On the contrary, if the reference clock CK1 is used as the reference operating clock, the operation speed can be doubled as compared to when using the divided clock O1 as the reference operating clock. However, it is needless to say that the power consumption increases as compared to when using the divided clock O1 as the reference operating clock.

The selection circuit 130 includes D flip-flops FF11 to FF26 and a selector SEL131. The D flip-flops FF11 to FF26 input the output clock OCK into their data input terminals D, respectively. Further, the D flip-flops FF11 to FF26 input divided clocks O1 to O16 into their clock input terminals, respectively. If the rising edges of the divided clocks O1 to O16 are input into each of the clock input terminals, respectively, the D flip-flops FF11 to FF26 hold the logical values input into their data input terminals D, and output the logical values as delay clocks F1 to F16 from their data output terminals Q. The selector SEL131 selects and outputs one of the delay clocks F1 to F16 output from the D flip-flops FF11 to FF26 according to the value of the delay amount data.

The high precision clock output terminal 150 outputs the delay clock output from the selector SEL131 to an external circuit as a high precision clock HQCK, which is an output from the PLL circuit 100.

Figure 7:
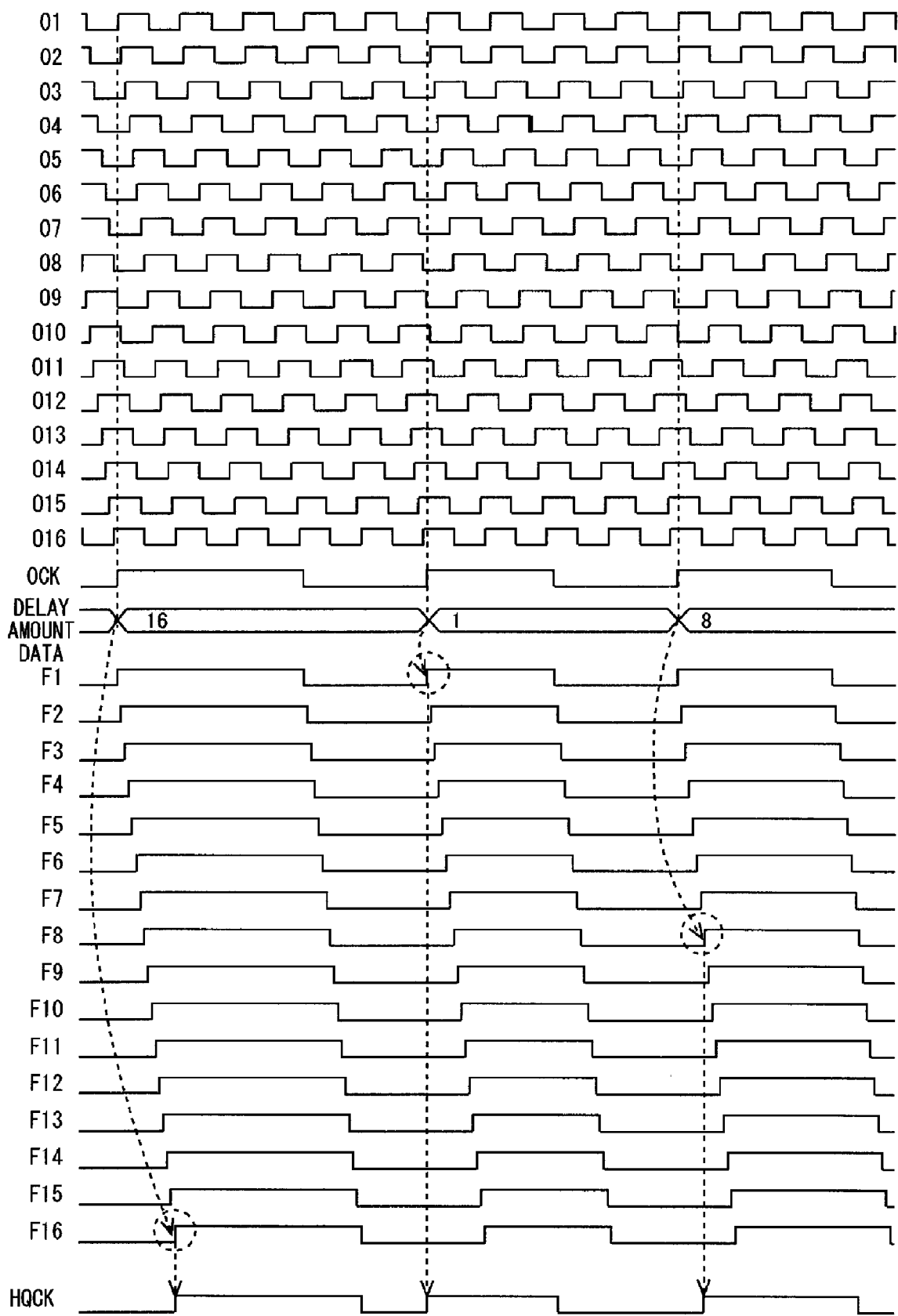
FIG. 7 is a timing chart illustrating the operation of the PLL circuit according to the first exemplary embodiment.

FIG. 7 is the timing chart illustrating the operation of the PLL circuit 100 with the above configuration. Note that in the example of FIG. 7, signal delay in the selector SEL131 is not taken into consideration. For the sake of simplicity of the drawing, the reference clocks CK1 to CK8 are omitted. The case in which the selector 170 selects the divided clock O1 is considered hereinafter.

First, in the PLL circuit 100, the polyphase reference clock output circuit 110 outputs eight layers of the reference clocks CK1 to CK8. The polyphase divide-by-two circuit 160 outputs the divided clocks O1 to O16, which are obtained by dividing the reference clocks CK1 to CK8 by two. The selector 170 selects the divided clock O1, and outputs it to the digital VCO 120 as the reference operating clock. Then, the digital VCO 120 outputs the output clock OCK synchronized with the divided clock O1, and the delay amount data which changes its value by synchronizing with a rising edge of the output clock OCK.

In the selection circuit 130, the D flip-flops FF11 to FF26 latch the logical value of the output clock OCK in response to the divided clocks O1 to O16 which are input to the clock input terminals respectively, and output the logical value as the delay clocks F1 to F16. That is, the rising edges of the delay clocks F1 to F16 are synchronized with the divided clocks O1 to O16 to be output. The selector SEL131 selects one of the delay clocks F1 to F16 according to the value of the delay amount data from the digital VCO 120.

For example, if the delay amount data is 16, the selector SEL131 selects and outputs the delay clock F16. This delay clock F16 is output as the high precision clock HQCK from the high precision clock output terminal 150. The value of the delay amount data is computed from the difference between the ideal phase and the phase of the output clock OCK by the digital VCO 120. If the delay amount data is 1, the selector SEL131 selects and outputs the delay clock F1. The delay clock F1 is output as the high precision clock HQCK from the high precision clock output terminal 150. If the delay amount data is 8, the selector SEL131 selects and outputs the delay clock F8. This delay clock F8 is output as the high precision clock HQCK from the high precision clock output terminal 150.

The delay amount of the delay clocks F1 to F16 is generated according to the delay amount of the divided clocks O1 to O16. Accordingly, the delay amount is adjusted to have a smaller step than the phase adjusting width of the output clock OCK. Therefore, the clock output from the selection circuit 130 has a small phase difference from the ideal clock, and has an extremely high phase precision. In the first exemplary embodiment, the clock output from the selection circuit 130 is referred to as the high precision clock.

In the abovementioned PLL circuit 100, the polyphase reference clock output circuit 110 outputs the reference clocks CK1 to CK8. Then, the polyphase divide-by-two circuit 160 outputs the divided clocks O1 to O16, which are obtained by dividing the reference clocks CK1 to CK8 by two. These divided clocks O1 to O16 include the phase difference between the reference clocks CK1 to CK8. Then, the D flip-flops FF11 to FF26 latch the output clock OCK generated by the digital VCO at clock timings of the divided clocks O1 to O16, and output them as polyphase delay clocks F1 to F16.

Then, the selector SEL131 outputs one of the delay clocks F1 to F16 as the high precision clock HQCK according to the delay amount data output from the digital VCO 120. Either the reference clock CK1 or the divided clock O1 selected by the selector 170 is used as the operating clock of the digital VCO 120. If the selector 170 uses the divided clock O1, which has a lower frequency than the reference clock CK1, as the operating clock, the power consumption of the digital VCO 120 can be lowered. On the contrary, if the selector 170 selects the reference clock CK1, the digital VCO 120 can operate at high speed. That is, it is possible to select the operation of the digital VCO 120 either low speed but low power consumption or high power consumption but high speed operation relative to the operation mode of the PLL circuit 100.

For example, if the power is supplied from AC adaptor or the like to an optical disc apparatus provided with the PLL circuit 100, and there is no problem in the power supply to the PLL circuit 100 or motor etc., the speed of record and reproduction of data can be increased by speeding up the rotation of an optical disc media, for example. In this case, the high speed operation of the digital VCO 120 can be possible if the selector 170 selects the reference clock CK1. Further, as the rotational speed of the optical disc media increases, the value of the frequency control input data Mf increases accordingly. Thus, the increase speed of the internal phase information Np for each reference operating clock (1/Fref) also increases, so does the clock frequency of the output clock OCK. As described above, if the reference clock CK1 having high clock frequency is used as the reference operating clock and the operation speed of the digital VCO 120 is increased, the cycle of the reference operating clock can be shortened. This enables to generate the output clock OCK accurately.

On the contrary, if the optical disc apparatus including the PLL circuit 100 operates only with the power supply from an interface such as USB, the power supply is limited. Thus the optical disc apparatus enters the low power consumption mode, and the power consumption of the PLL circuit 100 must be reduced as well. In this case, if the selector 170 selects the divided clock O1, the power consumption of the digital VCO 120 can be reduced, and thereby enabling to reduce the power consumption of the PLL circuit 100. In order to reduce the power consumption of a motor or the like, the rotational speed of the optical disc media is reduced. In such case, the value of the frequency control input data Mf decreases. Therefore, the increase speed of the internal phase information Np for each reference operating clock (1/Fref) slows down and the clock frequency of the output clock OCK also decreases. As the divided clock O1 having low clock frequency is used as the reference operating clock as described above, the operation speed of the digital VCO 120 is reduced, however as the clock frequency of the output clock OCK is also reduced, there is no problem in the accuracy for generating the output clock OCK.

As described so far, by switching the operating clock of the digital VCO 120 according to the operation mode of an optical disc apparatus provided with the PLL circuit 100, an optimal operation for the PLL circuit 100 such as high speed operation and low power consumption can be possible, therefore resolving the problem of the PLL circuit 1.

Second Exemplary Embodiment

A specific second exemplary embodiment incorporating the present invention is explained in detail with reference to the drawings. The second exemplary embodiment applies the present invention to a PLL circuit of an optical disc apparatus in a similar way as the first exemplary embodiment.

Figure 8:
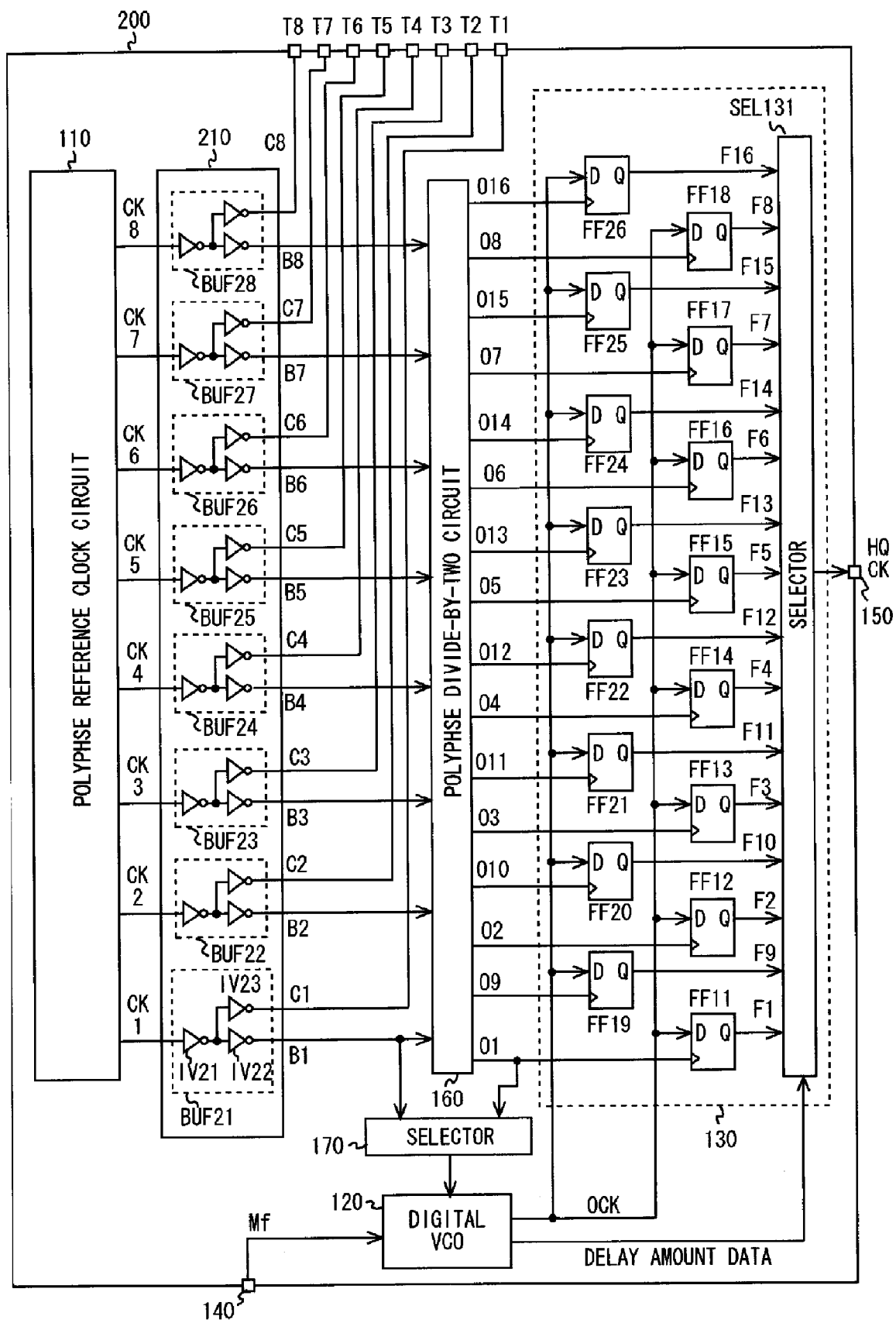
FIG. 8 is a circuit block diagram of a PLL circuit according to a second exemplary embodiment.

FIG. 8 illustrates the configuration of a PLL circuit 200 according to the first exemplary embodiment. As illustrated in FIG. 8, the PLL circuit 200 includes a polyphase reference clock output circuit 110, a, digital VCO 120, a selection circuit 130, a frequency control terminal 140, a high precision clock output terminal 150, a polyphase divide-by-two circuit 160, a selector 170, a polyphase buffer circuit 210, and external output terminals T1 to T8. Note that the symbols in FIG. 8 with the same symbols in FIG. 18 indicate the same or similar components in FIG. 1. The difference from the first exemplary embodiment is that the PLL circuit 200 further includes the polyphase buffer circuit 210 and the external output terminals T1 to T8. Accordingly, the explanation of the second exemplary embodiment focuses on the difference, and omits the explanation of the same or similar components as FIG. 1.

The polyphase buffer circuit 210 inputs the reference clocks CK1 to CK8 from the polyphase reference clock output circuit 110, performs current buffering, and outputs clocks B1 to B8, and C1 to C8 which have the same phase as the reference clocks CK1 to CK8. The clocks B1 to B8 are input to the subsequent stage polyphase divide-by-two circuit 160. The clocks B1 to B8 are processed substantially in a similar manner as the reference clocks CK1 to CK8 in the first exemplary embodiment. After the clocks B1 to B8 are input to the polyphase divide-by-two circuit 160, similar processes as in the first exemplary embodiment are performed.

The polyphase buffer circuit 210 includes buffer circuits BUF21 to BUF28, respectively. The buffer circuits BUF21 to BUF28 include three inverter circuits, respectively. Further, the buffer circuits BUF21 to BUF28 input the reference clocks CK1 to CK8, respectively, and output the clocks B1 to B8, and C1 to C8. For example, the buffer circuit BUF21 includes inverter circuits IV21 to IV23. The inverter circuit IV21 inputs the reference clock CK1, and outputs an output signal to input terminals of the inverter circuits IV22 and IV23. The inverter circuit IV22 inputs an output signal from the inverter circuit IV21, and outputs an output signal as the clock B1. The inverter circuit IV23 inputs the output signal from the inverter circuit IV21, and outputs an output signal as the clock C1. The other buffer circuits BUF22 to BUF28 have the same configuration as the buffer circuit BUF21.

Figure 9:
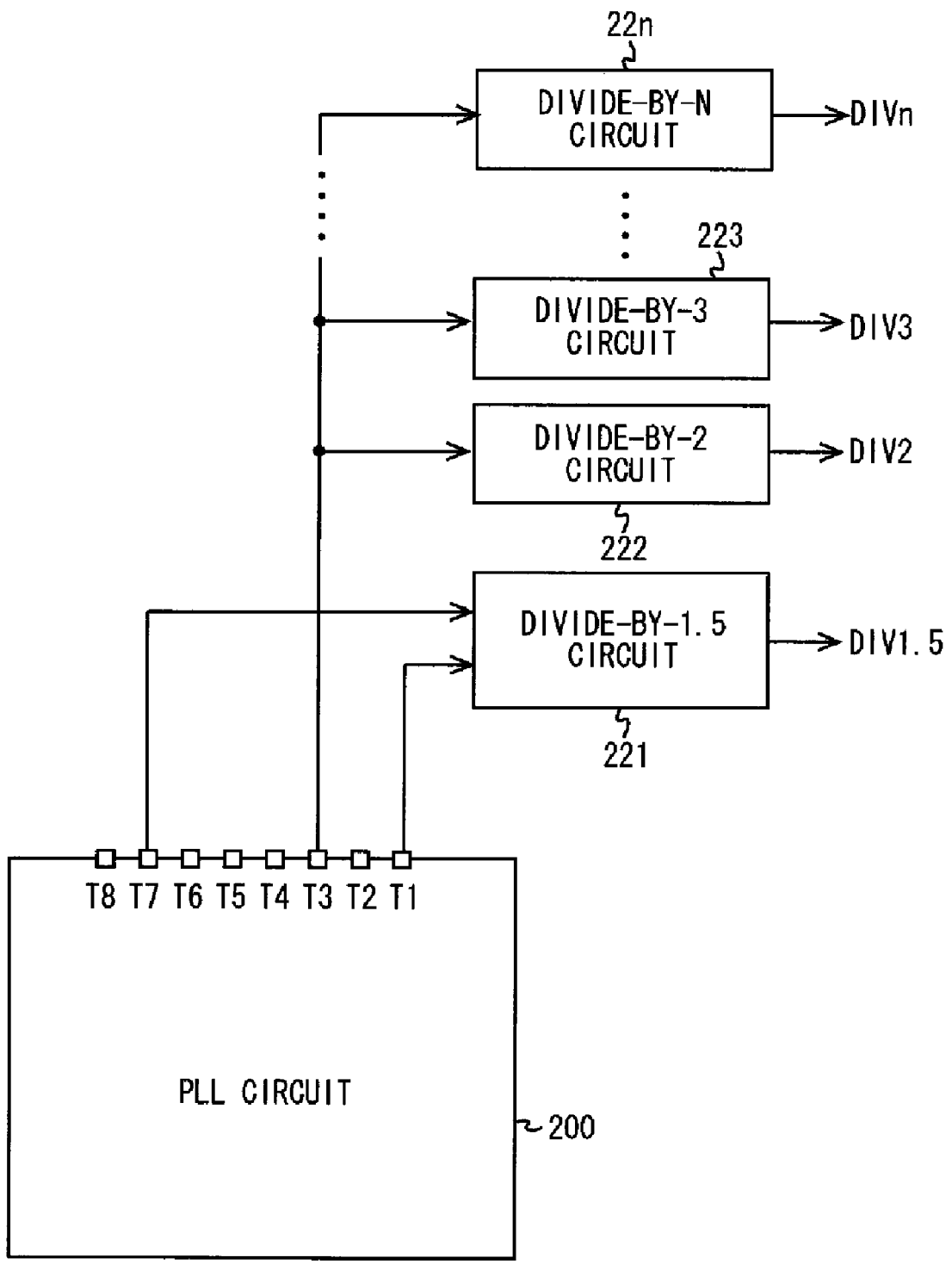
FIG. 9 is a block diagram illustrating the connection configuration of the PLL circuit according to the second exemplary embodiment and a frequency divider circuit connected with the PLL circuit.

The external output terminals T1 to T8 output the clocks C1 to C8. As illustrated in FIG. 9, a part of the clocks C1 to C8 output from the external output terminals T1 to T8 are input to frequency divider circuits 221 to 22*n* (n is a natural number of 2 or more). Then, the frequency divider circuits 221 to 22*n* output divided clocks DIV1.5, and DIV2 to DIVn, which are obtained by dividing the clock frequencies of the clocks C1 to C8 by a predetermined value. For example, in the example of FIG. 9, the frequency divider circuit 221 inputs the clocks C1 and C7, divides them by 1.5 and generates the clock DIV1.5.

Other frequency divider circuits 222 to 22*n* input the clock C3, divides by two to N, and generates clocks DIV2 to DIVn. Note that the clocks used by the frequency divider circuit 221 is not limited to C1 and C7, but may be any two clocks shifted by 270 degrees. The frequency divider circuits 222 to 22*n* can use any clock from the clocks C1 to C8.

Note that the clocks C1 to C8 are obtained by simply performing a current buffer to the reference clocks CK1 to CK8. Therefore, the frequency divider circuits 221 to 22*n* substantially divide the clock frequencies of the reference clocks CK1 to CK8 by 1.5, and two to N to generate divided clocks. Accordingly, if the current driving capacity of the buffer circuits BUF111 to BUF114 of the polyphase reference clock output circuit 110 has a level which can sufficiently drive the subsequent circuit, the polyphase buffer circuit 210 can be eliminated. In this case, the reference clocks CK1 to CK8 are directly output to the external output terminals T1 to T8, respectively.

Figure 10:
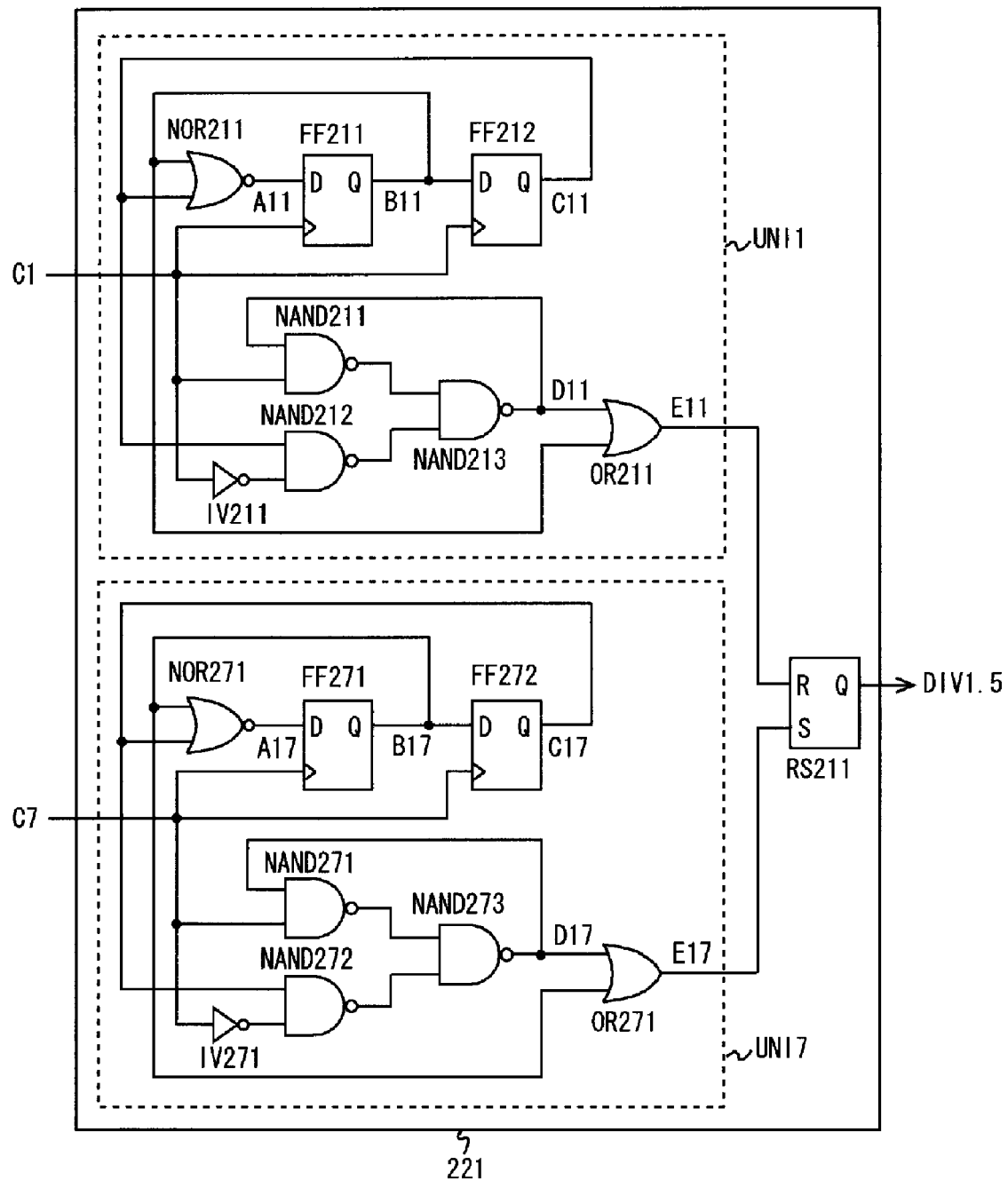
FIG. 10 is a circuit block diagram of a divide-by-1.5 circuit according to the second exemplary embodiment.

FIG. 10 is a circuit block diagram of the frequency divider circuit 221. As illustrated in FIG. 10, the frequency divider circuit 221 includes circuit units UNI1 and UNI7, and an RS latch circuit RS211. The circuit unit UNI1 includes a NOR circuit NOR211, D flip-flops FF211 and FF212, NAND circuits NAND211 to NAND213, an inverter circuit IV211, and an OR circuit OR211.

The D flip-flop FF211 connects a data input terminal D with a node A11, and a data output terminal Q with a node B11. The D flip-flop FF212 connects a data input terminal D with the node B11, and a data output terminal Q with a node C11. The clock C1 is input to the clock input terminals of the D flip-flops FF211 and FF212.

As for the NOR circuit NOR211, one input terminal is connected with the node B11, another input terminal is connected with the node C11, and an output terminal is connected with the node A11. As for the inverter circuit IV211, the clock C1 is input to an input terminal, and an output terminal is connected with one input terminal of the NAND circuit NAND212.

As for the NAND circuit NAND211, the clock C1 is input to one input terminal, another input terminal is connected with a node D11, and an output terminal is connected with one input terminal of the NAND circuit NAND213. As for the NAND circuit NAND212, one input terminal is connected with the node C11, another input terminal of the output terminal of the inverter circuit IV211, and an output terminal is connected with another input terminal of the NAND circuit NAND213. As for the NAND circuit NAND213, one input terminal is connected with the output terminal of the NAND circuit NAND211, another input terminal is connected with the output terminal of the NAND circuit NAND 212, and an output terminal is connected with the node D11. As for the OR circuit OR211, one input terminal is connected with the node D11, another input terminal is connected with the node B11, and an output terminal is connected with the node E11. Hereinafter, a signal output from the OR circuit 221 to the node E11 is referred to as a clock E11.

FIG. 11 is a table indicating logical values of each node A11, B11, C11, D11, and E11 for logical values of the clock C1, which is an input signal to the abovementioned circuit unit UN1. As illustrated in FIG. 11, the clock duty ratio of the clock C1 is 1:1, whereas that of the clock E11 output to the node E11 is 2:1.

The circuit unit UNI7 includes a NOR circuit NOR271, D flip-flops FF271 and FF272, NAND circuits NAND271 to NAND273, an inverter circuit IV271, and an OR circuit OR271.

As for the D flip-flop FF271, a data input terminal D is connected with a node A17, and a data output terminal Q is connected with a node B17. As for the D flip-flop FF272, a data input terminal D is connected with the node B17, and a data output terminal Q is connected with a node C17. The clock C7 is input to clock input terminals of the D flip-flops FF271 and FF272.

As for the NOR circuit NOR271, one input terminal is connected with the node B17, another input terminal is connected with the node C17, and an output terminal is connected with the node A17. As for the inverter circuit IV271, the clock C7 is input to an input terminal, and an output terminal is connected with one input terminal of the NAND circuit NAND272.

As for the NAND circuit NAND 271, the clock C7 is input to one input terminal, another input terminal is connected with a node D17, and an output terminal is connected with another input terminal of the NAND circuit NAND 273. As for the NAND circuit NAND272, one input terminal is connected with the node C17, another input terminal is connected with the output terminal of the inverter circuit IV271, and an output terminal is connected with another input terminal of the NAND circuit NAND273. As for the NAND circuit NAND213, another input terminal is connected with the output terminal of the NAND circuit NAND271, another input terminal is connected with the output terminal of the NAND circuit NAND 272, and an output terminal is connected with the node D17.

As for the OR circuit OR271, one input terminal is connected with the node D17, another input terminal is connected with the node B17, and an output terminal is connected with a node E17. Hereinafter, a signal output from the OR circuit 271 to the node E17 is referred to as a clock E17.

The logical values of each node A17, B17, C17, D17, and E17 for the logical value of the clock C7, which is an input signal to the abovementioned circuit unit UNI7, are substantially same as the logical values of each node A11, B11, C11, D11, and E11 illustrated in FIG. 11. Therefore, the clock duty ratio of the clock C7 is 1:1, whereas that of the clock E17 output to the node E17 is 2:1. However, the phases of the clocks C1 and C7 are shifted by 270 degrees, thus it should be noted that the phases of the clocks E11 and E17 are also shifted by 270 degrees.

As for the RS latch circuit RS211, a reset terminal R is connected with the node E11, and a set terminal S is connected with the node E17. Then, the divided-by-1.5 clock DIV1.5, which is the output of the frequency divider circuit 221, is output from a data output terminal Q.

Figure 12:
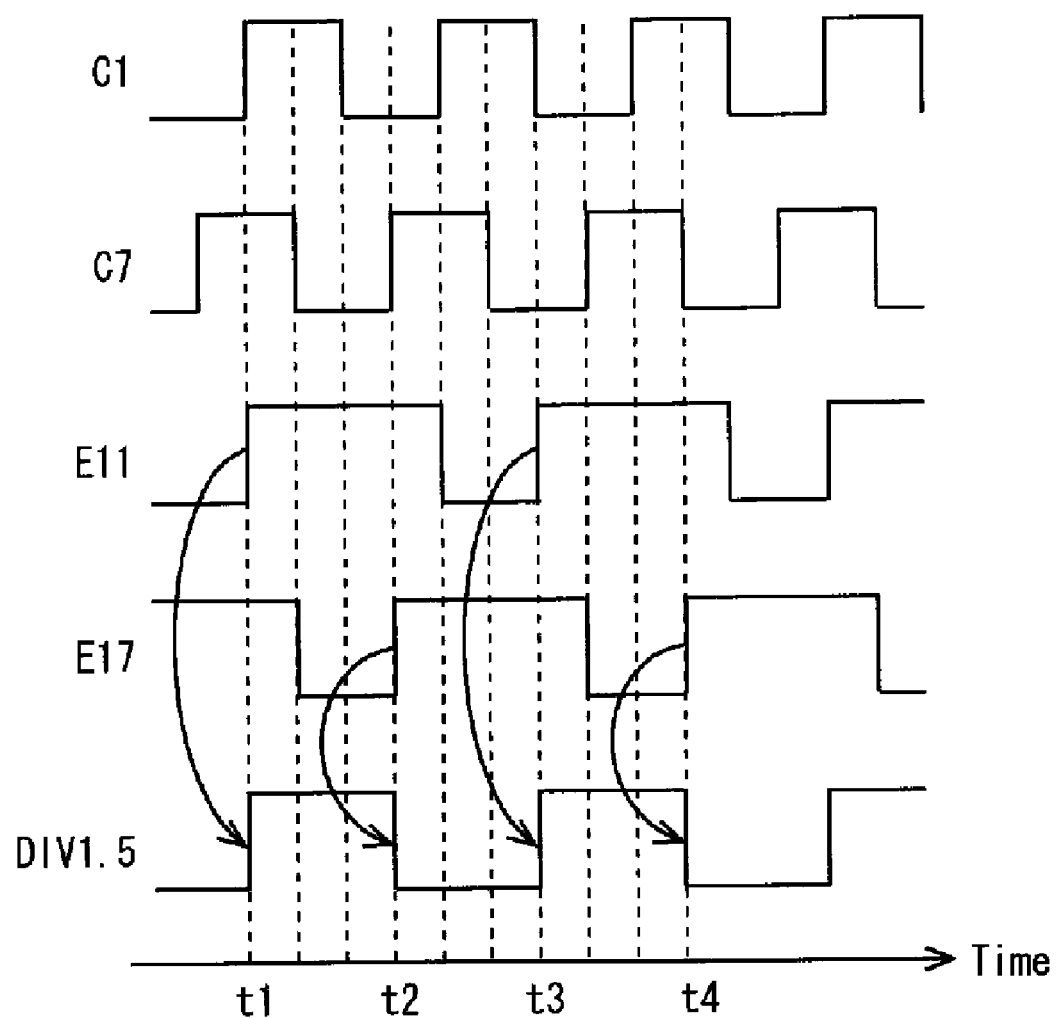
FIG. 12 is a timing chart illustrating the operation of the divide-by-1.5 circuit according to the second exemplary embodiment.

FIG. 12 is a timing chart indicating the operation of the frequency divider circuit 221 having above configuration. The RS latch circuit RS211 performs similar operations as a usual RS latch circuit. That is, if a high level pulse signal is input to the set terminal S (node E11), and an output logical value is set to high level, whereas if a high level pulse signal is input to the reset terminal R (node F17), the output logical value is set to low level. Therefore, at the time t1, the clock E11 rises to high level, thus the 1.5 divided clock DIV1.5 also rises to high level. At the time t1, the clock E17 rises to high level, thus the divided-by-1.5 clock DIV1.5 falls to low level. Similarly, at the time t3, the clock E11 rises to high level, thus divided-by-1.5 clock DIV1.5 also rises to high level. At the time t4, the clock E17 rises to high level, thus the divide-by-1.5 clock DIV1.5 falls to low level. Accordingly, the clock frequency of the divide-by-1.5 DIV1.5 is the clock frequency of the clock C1 or C7 divided by 1.5.

The frequency divider circuit 221 has been explained so far. Other frequency divider circuits 222 to 22n may be realized by the configuration of an existing general frequency divider circuit. Accordingly, the explanation of the configuration and the operation thereof is omitted, as it is well known in the art.

Figure 13:
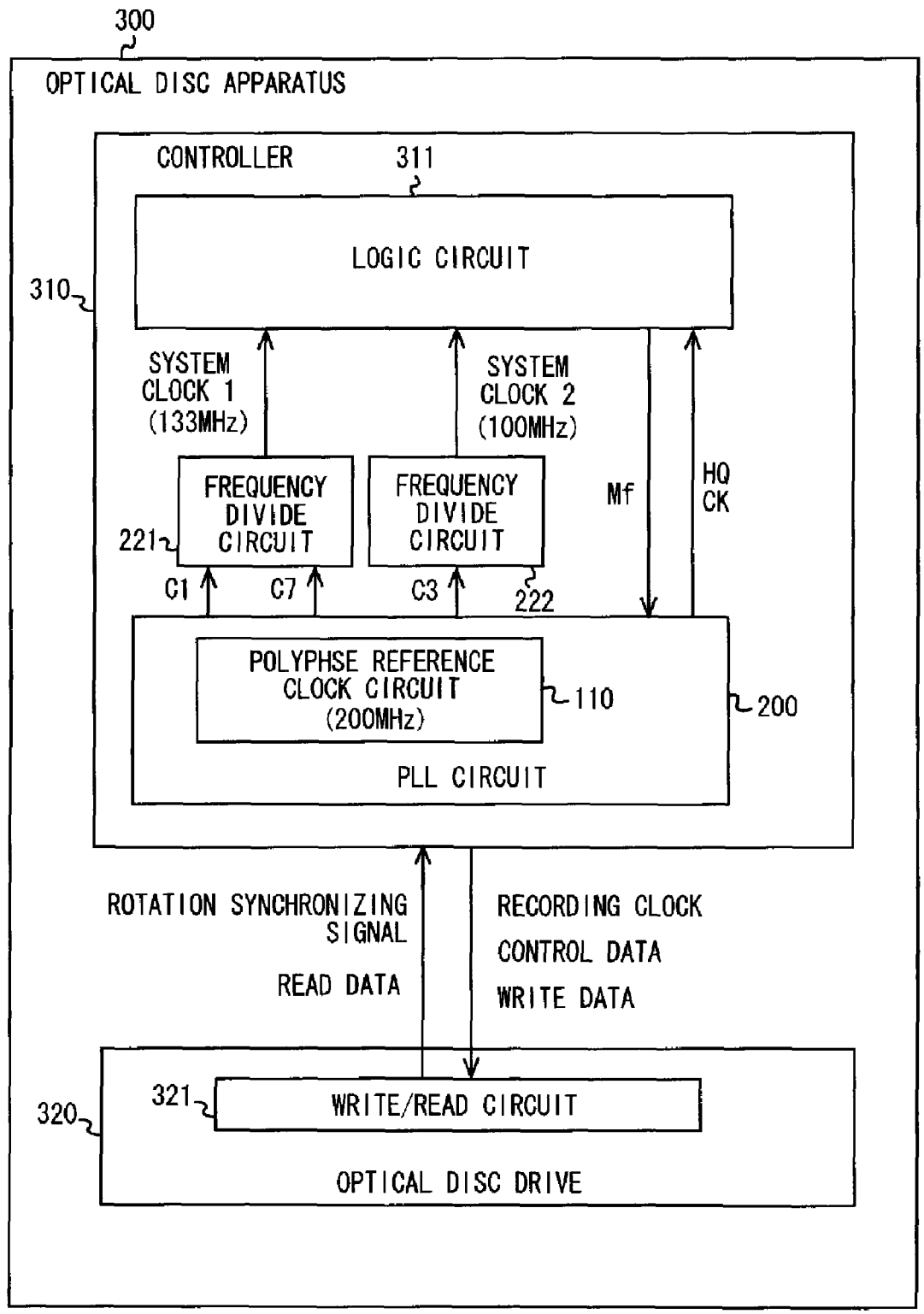
FIG. 13 is a block diagram of an optical disc apparatus according to the second exemplary embodiment.

FIG. 13 is a block diagram of an optical disc apparatus 300 using such PLL circuit 200, the frequency divider circuits 221 and 222. As illustrated in FIG. 13, the optical disc apparatus 300 includes a controller circuit 310 and an optical disc drive circuit 320. The controller circuit 310 includes the abovementioned PLL circuit 200, the frequency divider circuits 221 and 222, and a logic circuit 311. The optical disc drive circuit 320 includes a record data write and read circuit 321. The record data write and read circuit 321 transmits the data read from an optical disc, and a rotation synchronizing signal based on the wobble of the optical disc to the controller circuit 310. The record data write and read circuit 321 inputs a recording clock generated according to the high precision clock HQCK, and the write data to record in accordance with this recording clock or the like, from the controller circuit 310, and records the data to the optical disc. The record data write and read circuit 321 further inputs a pickup required at the time of the recording process and control data for controlling the motor from the controller circuit 310.

The logic circuit 311 uses 133 MHz and 100 MHz as a system clock. In this case, if the clock frequency of the reference clocks CK1 to CK8 output from the polyphase reference clock output circuit 110 is 200 MHz, the frequency divider circuit 221 can generate a system clock 1 with 133 MHz, which is divided by 1.5, and the frequency divider circuit 222 can generate a system clock 2 with 100 MHz, which is divided by two. Then the logic circuit 311 can operate with the system clocks 1 and 2 as operating clocks.

That is, in the optical disc apparatus 300 of the second exemplary embodiment, the system clock of the logic circuit 311 in the optical disc apparatus 300 is generated using the reference clock output from the polyphase reference clock output circuit 110 for generating the high precision clock HQCK.

Figure 14:
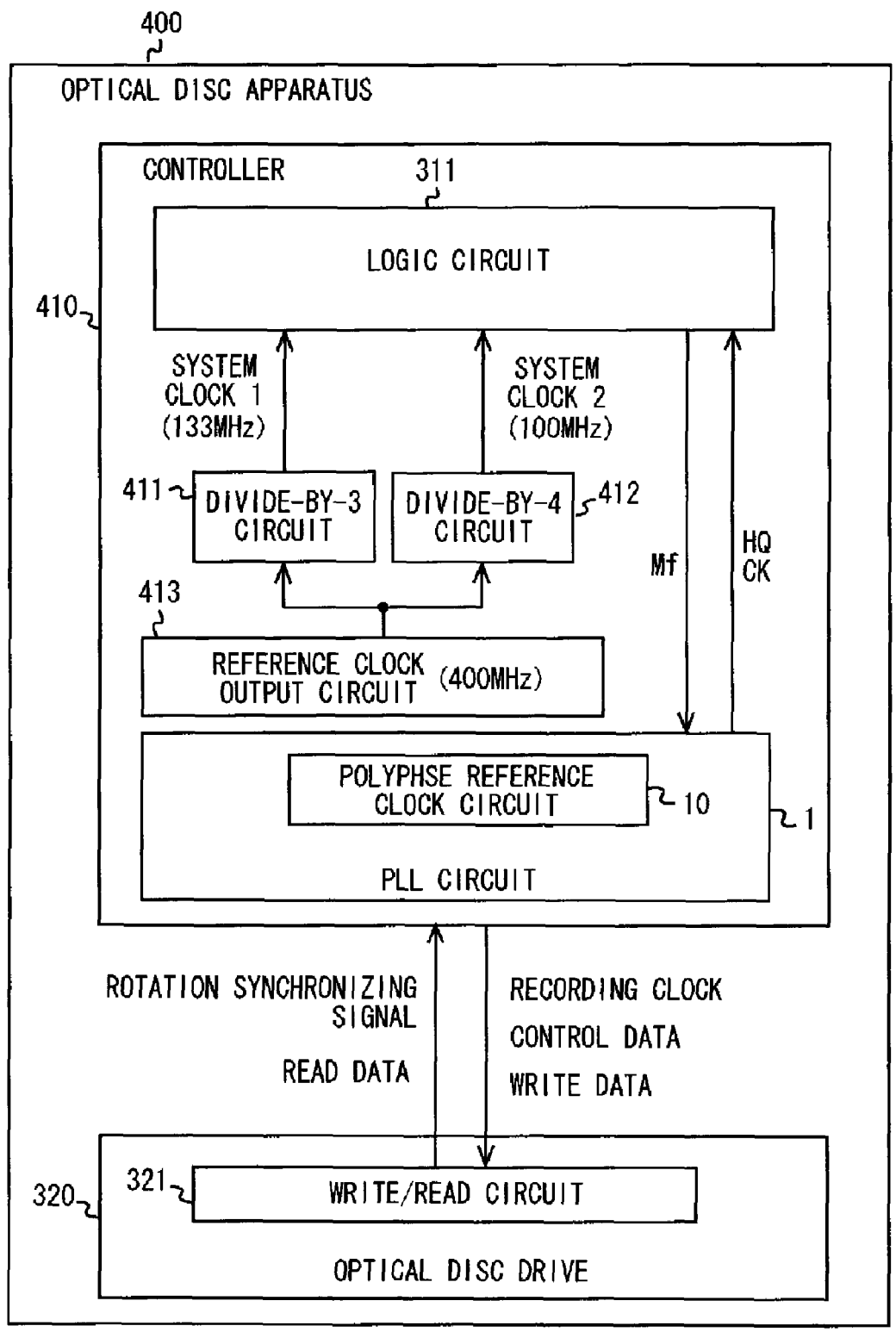
FIG. 14 is a block diagram of an optical disc apparatus according to a related art.

FIG. 14 illustrates an optical disc apparatus 400 according to a related art, which assumes the polyphase reference clock generated as in the PLL circuit 1 in the first exemplary embodiment or Japanese Unexamined Patent Application Publication No. 2008-205730 is not used externally. In this case, as illustrated in FIG. 14, a reference clock generating circuit 413 for usually generating the system clock of the logic circuit 311 is prepared separately from the PLL circuit 1 for generating the high precision clock HQCK. Accordingly, the optical disc apparatus 400 of FIG. 14 further requires the reference clock generation circuit 413 for generating the system clocks as compared to the optical disc apparatus 300 according to the second exemplary embodiment in FIG. 13. This means that the optical disc 400 has a larger circuit size than the optical disc apparatus 300 for the reference clock generation circuit 413. However, in the optical disc apparatus 300 of the second exemplary embodiment, the reference clock output from the polyphase reference clock output circuit 110 can be used to generate a system clock and as an operating clock of the PLL circuit 200. Therefore, it is possible to eliminate the circuit corresponding to the reference clock generating circuit 413, thereby enabling to reduce the circuit size. Moreover, the power consumption can be reduced as the power to the reference clock generating circuit 413 is unnecessary.

Further, in the optical disc apparatus 400 according to the related art, if the reference clock generation circuit cannot generate reference clocks with 270 degrees phase shift, and attempts to generate a system clock 1 with 133 MHz, which is fractionally divided, the reference clock to output must be increased to 400 MHz. The reason for this is that as the reference clock output circuit can only output a reference clock having a single frequency, a divide-by-three circuit 411 is required when trying to generate a system clock 1 with 133 MHz, which is fractionally divided. Note that a divide-by-four circuit 412 is used to generate a system clock 2 with 100 MHz.

On the other hand, in the optical disc apparatus 300 of the second exemplary embodiment, the polyphase reference clock output circuit 110 outputs multiple reference clocks having 270 degrees phase shift (for example, the reference clocks CK1 and CK7). Thus, by providing the frequency divider circuit 221 of divide-by-1.5 as illustrated in FIG. 10, the frequency of the reference clock output from the polyphase reference clock output circuit 110 can be suppressed to 200 MHz. As well known in the art, the power consumption of the circuit increases in proportion to the square of the operating frequency. Thus the power consumption of the reference clock output circuit 413 having 400 Mhz used in the optical disc apparatus 400 increases largely as compared to the power consumption of the polyphase reference clock output circuit 110 having 200 MHz, which is used in the optical disc apparatus 300 according to the second exemplary embodiment. In other words, the optical disc apparatus 300 of the second exemplary embodiment can operate with lower power consumption as compared with the optical disc apparatus 400.

FIG. 15 is a table that summarizes the above explanation for comparing each clock frequency used in the optical disc apparatus 300 with each clock frequency used in the optical disc apparatus 400 according to the second exemplary embodiment.

The present invention is not limited to the above exemplary embodiments, but can be modified as appropriate within the scope and the sprit of the present invention. For example, although the polyphase divide-by-two circuit 160 that divides the reference clocks by two is used in the first exemplary embodiment, a polyphase divide-by-N circuit (N is an integer of 2 or more) which divides the reference clocks CK1 to CK8 by N can be used instead. In the second exemplary embodiment, although the divide-by-1.5 circuit 221 is used, a fractional frequency divider circuit such as a divide-by-2.5 circuit, and divide-by-3.5 circuit may be used. Moreover, if the phase step of the reference clock output from the polyphase reference clock output circuit 110 can be smaller than 45 degrees, a frequency divider circuit, which outputs divided frequencies (for example, divide-by-1.1 and divide-by-1.2 frequencies etc.) of any value that can be generated using the polyphase reference clock, may be used.

Figure 16:
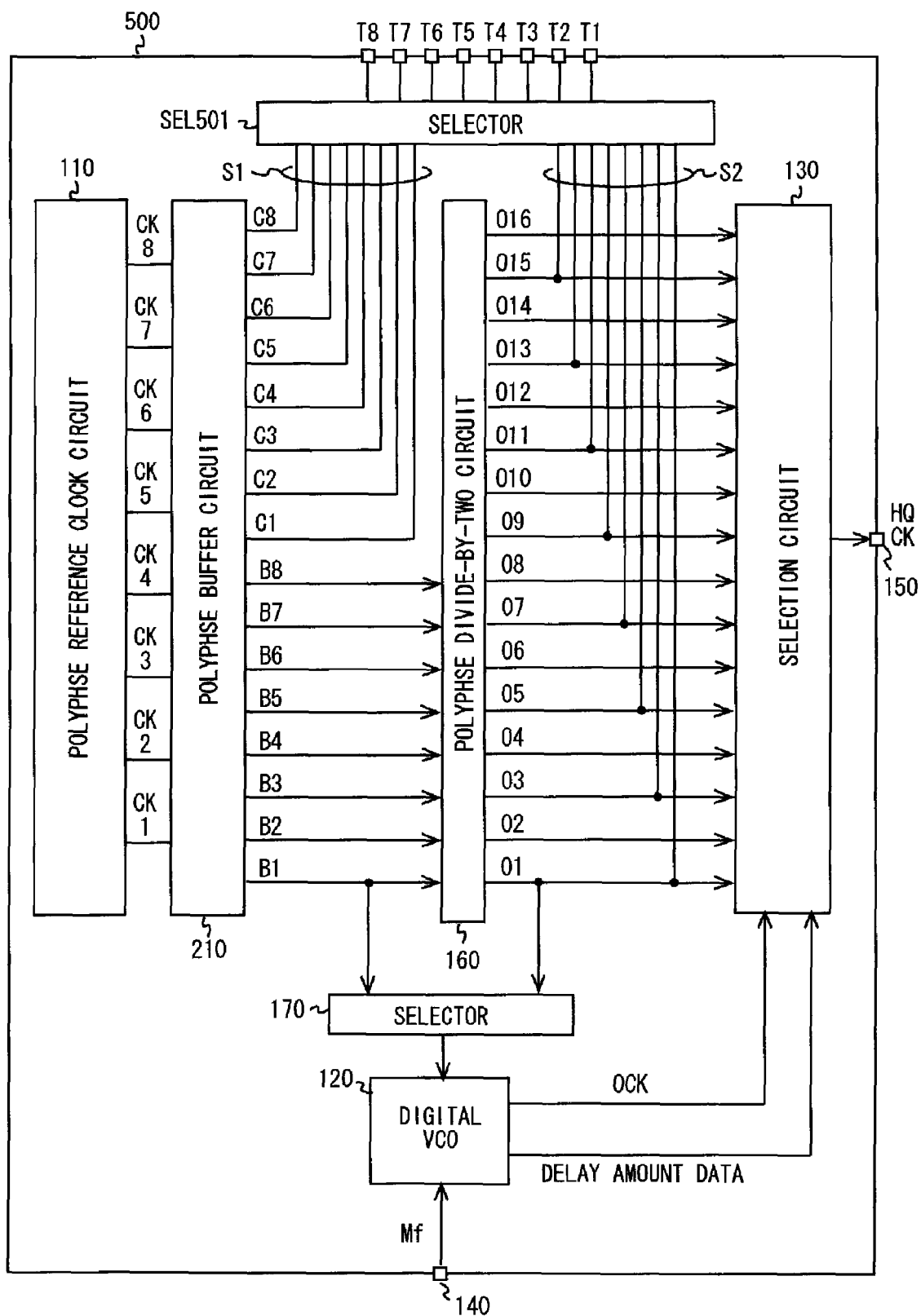
FIG. 16 is a circuit block diagram of a PLL circuit according to other exemplary embodiment.
Figure 17:
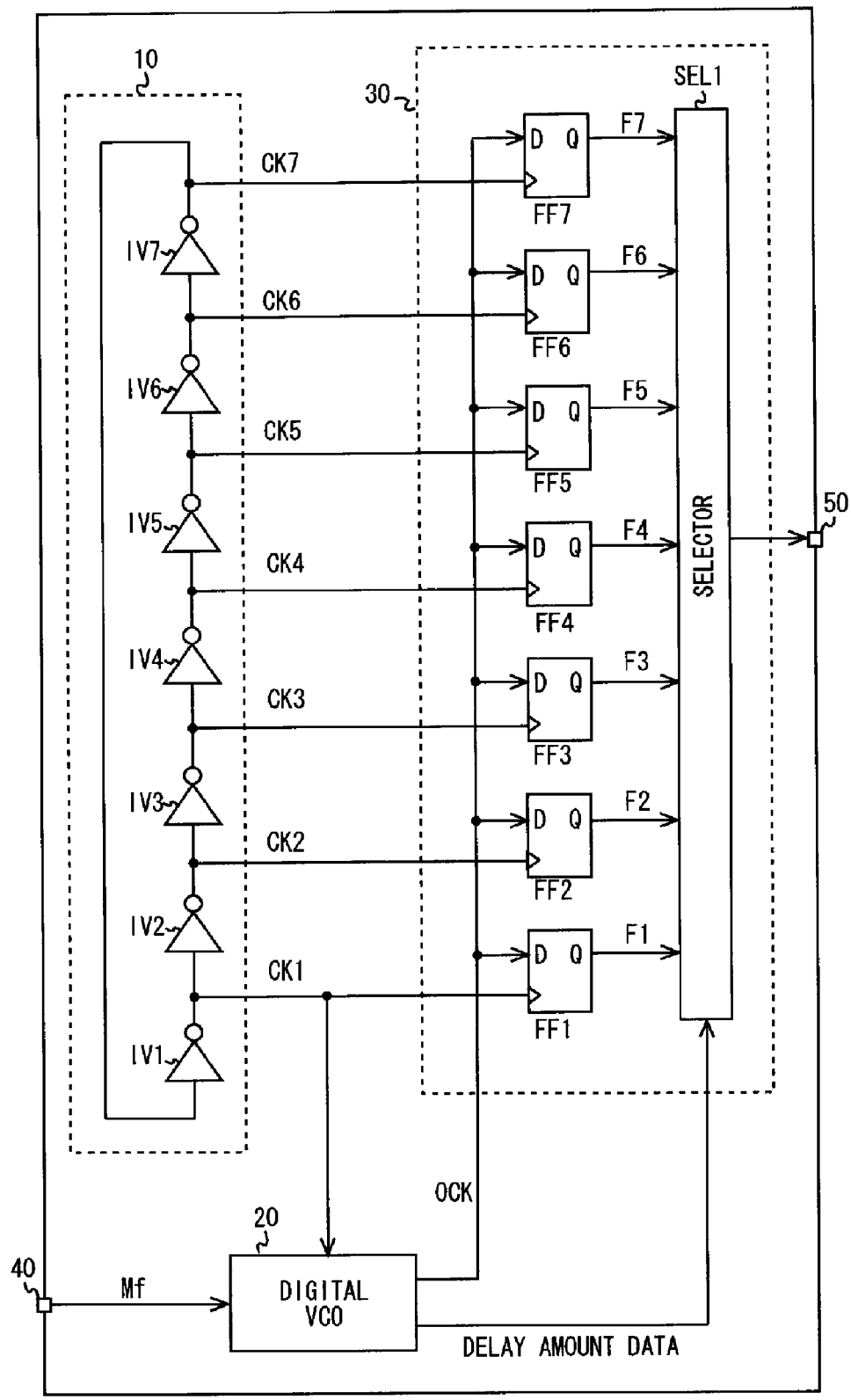
FIG. 17 is a circuit block diagram of a PLL circuit according to a prior art.

Further, as with the PLL circuit 500 illustrated in FIG. 16, the clock output to the external output terminals T1 to T8 may be the clocks C1 to C8 (hereinafter referred to a polyphase clock signal S1) from the polyphase buffer circuit 210 selected by the selector SEL501 or the divided clocks O1, O3, O5, O7, O9, O11, O13, or O15 (hereinafter referred to as a polyphase clock signal S2) from the polyphase divide-by-two circuit 160. Note that the symbols in FIG. 16 with the same symbols in FIG. 8 indicate the same or similar components in FIG. 8.

An exemplary advantage of replacing the PLL circuit 200 in the optical disc apparatus 300 of FIG. 13 with a PLL circuit 500 is explained hereinafter. Further, suppose that the polyphase reference clock output circuit 110 outputs a reference clock having clock frequency of 200 MHz.

In this case, if a selector SEL501 selects a polyphase clock signal S1, the frequency divider circuit 221 generates a system clock 1 having clock frequency of 133 MHz. Moreover, the frequency divider circuit 222 generates a system clock 2 having clock frequency of 100 MHz. On the other hand, if the selector SEL501 selects a polyphase clock signal S2, the frequency divider circuit 221 generates a system clock 2 having clock frequency of 66.6 MHz. Moreover, the frequency divider circuit 222 generates a system clock 2 having clock frequency of 50 MHz. In this way, by switching the signal selected by the selector SEL501, it is possible to switch the frequency of the system clock to be supplied to the logic circuit 311. Then, by reducing the system clock of the controller circuit 310 when the optical disc apparatus is set to the low power consumption mode, the power consumption of the optical disc apparatus 300 can further be reduced.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A PLL circuit comprising:
   a polyphase reference clock output circuit that outputs a plurality of reference clocks with different phases, the polyphase reference clock output circuit comprising a plurality of delay cells including a differential input and a differential output, the plurality of delay cells being connected in series, and the reference clock is output from each output of the plurality of delay cells;
   a polyphase frequency divider circuit that outputs a plurality of divided clocks, the plurality of divided clocks being obtained by dividing frequencies of the plurality of reference clocks by a predetermined value;
   a selection switch circuit that selects one of the plurality of reference clocks or one of the plurality of divided clocks, and outputs the selected clock as a selected clock;
   a digital VCO that uses the selected clock as an operating clock, and outputs delay amount data indicating a phase difference between an output clock and an ideal phase, the output clock including a frequency that fluctuates according to a value of frequency control input data, and the ideal phase being calculated according to the output clock and the value of the frequency control input data; and
   a selection circuit that selects and outputs the output clock, the output clock being synchronized with one of the plurality of divided clocks according to the delay amount data.

2. The PLL circuit according to claim 1, wherein the polyphase divider circuit sets a phase difference between divided clocks of the plurality of divided clocks to be same as a phase difference between reference clocks of the plurality of reference clocks.

3. The PLL circuit according to claim 1, wherein the digital VCO increases a frequency of the output clock as the value of the frequency control data increases.

4. The PLL circuit according to claim 1, further comprising a first frequency divider circuit that is connected with the PLL circuit, and outputs a first clock, the first clock being obtained by dividing a clock frequency of the plurality of reference clocks or the plurality of divided clocks by a predetermined value.

5. The PLL circuit according to claim 4, wherein the first frequency divider circuit outputs a first clock, the first clock being obtained by fractionally dividing the frequency of the plurality of reference clocks or the plurality of divided clocks.

6. The PLL circuit according to claim 5, wherein the first frequency divider circuit outputs the first clock divided by 1.5 using clocks with a 270 phase shift among the plurality of reference clocks or the plurality of divided clocks.

7. The PLL circuit according to claim 4, wherein
the PLL circuit is used in an optical disc apparatus, and
the optical disc apparatus comprises:
the PLL circuit;
the first frequency divider circuit; and
a logic circuit,
wherein the logic circuit operates using the first clock output from the first frequency divider circuit as a system clock.

8. An optical disc apparatus comprising:
the PLL circuit according to claim 4;
the first frequency divider circuit; and
a logic circuit,
wherein the logic circuit operates using the first clock output from the first frequency divider circuit as a system clock.

9. A PLL circuit comprising:
a polyphase reference clock output circuit that outputs a plurality of reference clocks with different phases;
a polyphase frequency divider circuit that outputs a plurality of divided clocks, the plurality of divided clocks being obtained by dividing frequencies of the plurality of reference clocks by a predetermined value, the polyphase frequency divider circuit being configured to set a phase difference between divided clocks of the plurality of divided clocks to be same as a phase difference between reference clocks of the plurality of reference clocks;
a selection switch circuit that selects one of the plurality of reference clocks or one of the plurality of divided clocks, and outputs the selected clock as a selected clock;
a digital VCO that uses the selected clock as an operating clock, and outputs delay amount data indicating a phase difference between an output clock and an ideal phase, the output clock including a frequency that fluctuates according to a value of frequency control input data, and the ideal phase being calculated according to the output clock and the value of the frequency control input data; and
a selection circuit that selects and outputs the output clock, the output clock being synchronized with one of the plurality of divided clocks according to the delay amount data, wherein the polyphase divider circuit comprises:
a plurality of first latch circuits that are connected in series, latch an output of a previous stage in response to each of the plurality of reference clocks as a trigger signal, and output the plurality of divided clocks from each output terminal; and
a first inverter circuit,
wherein the first inverter inputs an output of a first stage latch circuit among the plurality of first latch circuits, and outputs the output to the first stage latch circuit.

10. A PLL circuit comprising:
a polyphase reference clock output circuit that outputs a plurality of reference clocks with different phases;
a polyphase frequency divider circuit that outputs a plurality of divided clocks, the plurality of divided clocks being obtained by dividing frequencies of the plurality of reference clocks by a predetermined value;
a selection switch circuit that selects one of the plurality of reference clocks or one of the plurality of divided clocks, and outputs the selected clock as a selected clock;
a digital VCO that uses the selected clock as an operating clock, and outputs delay amount data indicating a phase difference between an output clock and an ideal phase, the output clock including a frequency that fluctuates according to a value of frequency control input data, and the ideal phase being calculated according to the output clock and the value of the frequency control input data; and
a selection circuit that selects and outputs the output clock, the output clock being synchronized with one of the plurality of divided clocks according to the delay amount data, wherein the selection circuit comprises:
a plurality of second latch circuits that are connected with the plurality of divided clocks respectively; and
a selector that selects one of the plurality of delay clocks output from each of the plurality of second latch circuits,
wherein the plurality of second latch circuits latch the output clock in response to a corresponding divided clock as a trigger signal.

* * * * *